(12) United States Patent
Hoshi

(10) Patent No.: US 11,575,040 B2
(45) Date of Patent: Feb. 7, 2023

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/161,931

(22) Filed: Jan. 29, 2021

(65) Prior Publication Data
US 2021/0280712 A1 Sep. 9, 2021

(30) Foreign Application Priority Data

Mar. 4, 2020 (JP) .............................. JP2020-037303

(51) Int. Cl.
*H01L 29/78* (2006.01)
*H01L 27/088* (2006.01)
(Continued)

(52) U.S. Cl.
CPC ........ *H01L 29/7813* (2013.01); *H01L 27/088* (2013.01); *H01L 29/1608* (2013.01); *H01L 29/4236* (2013.01); *H01L 29/66734* (2013.01)

(58) Field of Classification Search
CPC ............... H01L 29/7813; H01L 27/088; H01L 29/1608; H01L 29/4236; H01L 29/66734; H01L 21/823487; H01L 29/0623; H01L 29/0696; H01L 29/0878; H01L 29/1095; H01L 29/41766; H01L 29/66068; H01L 29/7803; H01L 29/7804; H01L 29/7815; H01L 29/7375; H01L 29/7393–7395; H01L 29/7397; H01L 29/66325;
(Continued)

(56) References Cited

U.S. PATENT DOCUMENTS 6,060,744 A 5/2000 Kuwahara et al.
2012/0007139 A1 1/2012 Tanaka
(Continued)

FOREIGN PATENT DOCUMENTS

JP H10132871 A 5/1998
JP 2018026511 A 2/2018
(Continued)

*Primary Examiner* — Cuong B Nguyen
(74) *Attorney, Agent, or Firm* — Rabin & Berdo, P.C.

(57) ABSTRACT

A semiconductor device includes a first MOS structure portion that includes, as its elements, a semiconductor substrate of a first conductivity type, a first semiconductor layer of the first conductivity type, a first second-semiconductor-layer of a second conductivity type, first semiconductor regions of the first conductivity type, and first gate insulating films, and a second MOS structure portion that includes, as its elements, the substrate, the first semiconductor layer, a second second-semiconductor-layer, second first-semiconductor-regions of the first conductivity type, and second gate insulating films. First and second portions include all of the elements of the first and second MOS structure portions other than the first and second first-semiconductor-regions and the first and second gate insulating films, respectively. A structure of one of the elements of the first portion is not identical to a structure of a corresponding element of the second portion.

11 Claims, 11 Drawing Sheets

(51) Int. Cl.
*H01L 29/423* (2006.01)
*H01L 29/66* (2006.01)
*H01L 29/16* (2006.01)

(58) Field of Classification Search
CPC .................. H01L 29/66333–66348; H01L 29/66712–66734; H01L 29/7802–7815; H01L 33/486; H01L 24/08; H01L 24/48; H01L 33/38; H01L 33/54; H01L 33/62; H01L 33/641; H01L 33/642; H01L 2224/48091; H01L 2224/48227; H01L 2924/15174; H01S 5/02208; H01S 5/023; H01S 5/0233; H01S 5/0235; H01S 5/0425
See application file for complete search history.

(56) References Cited

U.S. PATENT DOCUMENTS

| | | |
|---|---|---|
| 2015/0179758 A1 | 6/2015 | Ata |
| 2016/0211361 A1* | 7/2016 | Nishimura .......... H01L 29/7805 |
| 2016/0372460 A1 | 12/2016 | Momota et al. |
| 2018/0047821 A1 | 2/2018 | Iwasaki |
| 2019/0123195 A1 | 4/2019 | Suekawa |

FOREIGN PATENT DOCUMENTS

| | | |
|---|---|---|
| WO | 2009096412 A1 | 8/2009 |
| WO | 2010109596 A1 | 9/2010 |
| WO | 2014013618 A1 | 1/2014 |
| WO | 2017002255 A1 | 1/2017 |

* cited by examiner

SEMICONDUCTOR DEVICE

CROSS REFERENCE TO RELATED APPLICATIONS

This application is based upon and claims the benefit of priority of the prior Japanese Patent Application No. 2020-037303, filed on Mar. 4, 2020, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than that of silicon, such as, for example, gallium nitride (GaN). Therefore, use of a wide bandgap semiconductor enables high withstand voltage for semiconductor devices.

A structure of a conventional silicon carbide semiconductor device is described taking a trench-type vertical MOSFET as an example. FIG. 12 is a top view of the structure of the conventional silicon carbide semiconductor device. As depicted in FIG. 12, a silicon carbide semiconductor device 1600 includes, in an outer periphery of an active region 1150 through which main current flows, an edge termination region 1168 that surrounds a periphery of the active region 1150 and sustains breakdown voltage. In the active region 1150, a gate electrode pad 1100 that is electrically connected to gate electrodes and a first source electrode pad 1015a that is electrically connected to first source electrodes 1013a are each provided.

To enhance reliability of the silicon carbide semiconductor device, a semiconductor device has been proposed in which a high-function region 1400 such as a current sensing portion, a temperature sensing portion, and an over-voltage protecting portion, is disposed on a single semiconductor substrate having the silicon carbide semiconductor device 1600. In an instance of high-function structures, to stably form the high-function region 1400, in the active region 1150, separate from unit cells of main semiconductor device element and adjacent to the edge termination region 1168, a region is provided in which only the high-function region 1400 is disposed. The active region 1150 is a region through which the main current passes when the main semiconductor device element is ON. The edge termination region 1168 is a region for mitigating electric field of a front side of the semiconductor substrate and sustaining breakdown voltage (withstand voltage). The breakdown voltage is a limit voltage at which no erroneous operation or destruction of a device element occurs.

In the current sensing portion, the active region 1230 of the current sensing portion having a structure similar to that of the active region 1150 and a second source electrode pad 1015b of the current sensing portion for detecting current are provided. The temperature sensing portion has a function of detecting a temperature of the semiconductor chip, using diode temperature characteristics; and one anode electrode pad 1201A and a cathode electrode pad 1201B of the temperature sensing portion are provided.

FIG. 13 is a cross-sectional view of the structure of the conventional silicon carbide semiconductor device along cutting line A-A' in FIG. 12. FIG. 13 is a cross-sectional view of the structure of the silicon carbide semiconductor device in which a conventional trench-type MOSFET is used. In the silicon carbide semiconductor device 1600, on a front surface of an $n^+$-type silicon carbide substrate 1001, an n-type silicon carbide epitaxial layer 1002 is deposited. In the active region 1150, first n-type high-concentration regions 1005a are provided in the n-type silicon carbide epitaxial layer 1002, at a first surface thereof that is opposite a second surface thereof that faces the $n^+$-type silicon carbide substrate 1001. Further, in the first n-type high-concentration regions 1005a, first second-$p^+$-type base regions 1004a are selective provided underlying an entire area of each bottom of first trenches 1018a. First first-$p^+$-type base regions 1003a are selectively formed in a surface layer of each of the first n-type high-concentration regions 1005a, at a first surface thereof that is opposite a second surface thereof that faces the $n^+$-type silicon carbide substrate 1001.

Further, in the active region 1150 of the conventional the silicon carbide semiconductor device 1600, a first p-type base layer 1006a, first $n^+$-type source regions 1007a, first $p^{++}$-type contact regions 1008a, first gate insulating films 1009a, first gate electrodes 1010a, an interlayer insulating film 1011, the first source electrodes 1013a, a back electrode 1014, the first trenches 1018a, the first source electrode pad 1015a, and a drain electrode pad (not depicted) are provided.

The first source electrodes 1013a are provided on the first $n^+$-type source regions 1007a and the first $p^{++}$-type contact regions 1008a; the first source electrode pad 1015a is a multilayered film in which a first TiN film 1025, a first Ti film 1026, a second Ti film 1027, a second Ti film 1028, and an Al alloy film 1029 are sequentially stacked. Further, a plating film 1016, solder 1017, external terminal electrodes 1019, first protective films 1021, and second protective films 1023 are provided on a top of the first source electrode pad 1015a.

Further, in the high-function region 1400 of the conventional the silicon carbide semiconductor device 1600, the current sensing portion 1037a is provided. The current sensing portion 1037a is a vertical MOSFET having a fewer number of unit cells (functional units of a device element) than does a main semiconductor device element 1042, the unit cells of the current sensing portion 1037a having a configuration similar to the configuration of those of the main semiconductor device element 1042. The current sensing portion 1037a is disposed separate from the main semiconductor device element 1042. The current sensing portion 1037a operates under conditions identical to those of the main semiconductor device element 1042 and detects overcurrent (OC) flowing in the main semiconductor device element 1042. The unit cells of the current sensing portion 1037a are disposed in the active region 1230 that is a region directly beneath the second source electrode pad 1015b of the current sensing portion 1037a.

In the active region 1230 of the current sensing portion, a structure similar to that of the main semiconductor device element 1042 is provided. In other words, in the active region 1230 of the current sensing portion, second n-type high-concentration regions 1005b are provided in the n-type silicon carbide epitaxial layer 1002, at the first surface thereof that is opposite the second surface thereof that faces the $n^+$-type silicon carbide substrate 1001. Further, in the second n-type high-concentration regions 1005b, second second-$p^+$-type base regions 1004b are selectively provided underlying an entire area of each bottom of second trenches 1018b. In a surface layer of each of the second n-type high-concentration regions 1005b, at a first surface thereof opposite a second surface thereof that faces the $n^+$-type silicon carbide substrate 1001, second first-$p^+$-type base regions 1003b are selectively provided.

Further, a second p-type base layer 1006b, second $n^+$-type source regions 1007b, second $p^{++}$-type contact regions 1008b, second gate insulating films 1009b, second gate electrodes 1010b, the interlayer insulating film 1011, second source electrodes 1013b, the back electrode 1014, the second source electrode pad 1015b, the second trenches 1018b, and the drain electrode pad (not depicted) are provided.

In a portion of the current sensing portion 1037a excluding the active region 1230 thereof, similarly to the main semiconductor device element 1042, on a top of the second source electrode pad 1015b, the plating film 1016, the solder 1017, the external terminal electrodes 1019, the first protective films 1021, and the second protective films 1023 are provided.

Further, a known semiconductor device is designed such that a diffusion depth of a p-body region of a device element is shallower than a diffusion depth of a p-body region of a current detecting device element, whereby destruction of the current detecting device element during reverse bias may be prevented (for example, refer to International Publication No. WO 2009/096412).

Further, a known semiconductor device includes a main cell that outputs current and a sensing cell that outputs a sensing current proportional to a main current, and a threshold voltage of the sensing cell is set to be higher than a threshold voltage of the main cell, whereby unbalance of a ratio of main current to sensing current is suppressed without increasing manufacturing cost (for example, refer to International Publication No. WO 2014/013618).

Further, in a known semiconductor device, by setting a contact area between a current detecting electrode and a source region in a current detecting cell to be greater than a contact area between a base region and a current detecting electrode of a main current region, the semiconductor device accurately detects current even when detection voltage increases and a parasitic resistance value suddenly decreases, (for example, refer to Japanese Laid-Open Patent Publication No. H10-132871).

SUMMARY OF THE INVENTION

According to an embodiment of the invention, a semiconductor device includes a first MOS structure portion having the following elements: a semiconductor substrate of a first conductivity type, having a front surface and a back surface opposite to each other; a first semiconductor layer of the first conductivity type, provided on the front surface of the semiconductor substrate and having an impurity concentration that is lower than an impurity concentration of the semiconductor substrate, the first semiconductor layer having a first surface and a second surface opposite to each other, the second surface facing the semiconductor substrate; a first second-semiconductor-layer of a second conductivity type, provided on the first surface of the first semiconductor layer, the first second-semiconductor-layer having a first surface and a second surface opposite to each other, the second surface facing the semiconductor substrate; a plurality of first first-semiconductor-regions of the first conductivity type, selectively provided in the first second-semiconductor-layer, at the first surface thereof, each of the first first-semiconductor-regions having a first surface and a second surface opposite to each other, the second surface facing the semiconductor substrate; a plurality of first gate insulating films in contact with the first second-semiconductor-layer, each of the first gate insulating films having a first surface and a second surface opposite to each other, the second surface being in contact with the first second-semiconductor-layer; a plurality of first gate electrodes provided on the first surfaces of the first gate insulating films; a plurality of first first-electrodes provided on the first surface of the first second-semiconductor-layer and the first surface of each of the first first-semiconductor-regions; and a second electrode provided on the back surface of the semiconductor substrate; a second MOS structure portion that detects overcurrent flowing in the first MOS structure portion, the second MOS structure portion including the following elements: the semiconductor substrate; the first semiconductor layer; a second second-semiconductor-layer of the second conductivity type, provided on the first surface of the first semiconductor layer; a plurality of second first-semiconductor-regions of the first conductivity type, selectively provided in the second second-semiconductor-layer, at the first surface thereof, each of the second first-semiconductor-regions having a first surface and a second surface opposite to each other, the second surface facing the semiconductor substrate; a plurality of second gate insulating films in contact with the second second-semiconductor-layer, each of the second gate insulating films having a first surface and a second surface opposite to each other, the second surface being in contact with the second second-semiconductor-layer; a plurality of second gate electrodes provided on the first surfaces of the second gate insulating films; a plurality of second first-electrodes provided on the first surface of the second second-semiconductor-layer and the first surfaces of the second first-semiconductor-regions; and the second electrode; a first portion that includes all of the elements of the first MOS structure portion other than the first first-semiconductor-regions and the first gate insulating films, and being located below the first surface of the first first-semiconductor-regions; and a second portion that includes all of the elements of the second MOS structure portion other than the second first-semiconductor-regions and the second gate insulating films, and being located below the first surface of the second first-semiconductor-regions. A structure of at least one of the elements of the first portion that includes any one of a thickness or width thereof is not identical to a structure of a functionally corresponding at least one element of the second portion so that the first MOS structure has a MOS characteristic different from a MOS characteristic of the second MOS structure.

Objects, features, and advantages of the present invention are specifically set forth in or will become apparent from the following detailed description of the invention when read in conjunction with the accompanying drawings.

DETAILED DESCRIPTION OF THE INVENTION

Figure 14:
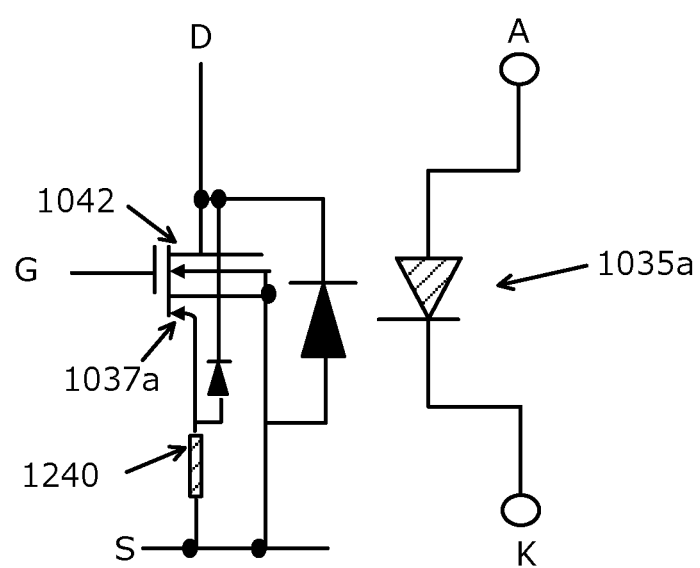
FIG. 14 is an equivalent circuit diagram of a current sensing portion 1037a and a temperature sensing portion 1035a of the conventional silicon carbide semiconductor device.

First, problems associated with the conventional techniques are discussed. FIG. 14 is an equivalent circuit diagram of the current sensing portion 1037a and a temperature sensing portion 1035a of the conventional silicon carbide semiconductor device. As depicted in FIG. 14, portions configuring the current sensing portion 1037a are different from the main semiconductor device element 1042 and are used via sensing resistance 1240 between earth potential and a source electrode of the current sensing portion 1037a. The current sensing portion 1037a, by an external circuit, monitors voltage generated at the sensing resistance 1240 and current distributed to the current sensing portion 1037a when large current flows, and according to this sensing voltage, reduces the gate voltage, blocks the current, and suppresses heat generation of the device element.

Nonetheless, when the resistance value of the sensing resistance 1240 increases to at least 1 kΩ and the difference with the earth potential increases, current is applied, whereby even when design equivalent to that of the main semiconductor device element 1042 is performed, the structures are equivalent and therefore, mirrored operation with the main semiconductor device element 1042 becomes difficult. In particular, during transient phenomena such as turn ON at the time of switching, at the main semiconductor device element 1042 having a large area and at the current sensing portion 1037a having a small area, the respective areas differ and therefore, capacitance components differ. Thus, the displacement current difference associated with external current differs among current components during transition and a sensing voltage value in the current sensing portion 1037a different from a value during normal current easily occurs, whereby errors in overcurrent occur.

Moreover, when semiconductor device elements are connected in parallel, response to transient dv/dt is impossible and sensing voltage increases, causing variation in current limits, and large current above a certain current may flow and conversely, current may be limited to below a certain current and a device element may be destroyed or current may be blocked. Further, while the above is a constant carrier frequency (up to 10 kHz), in a MOS gate device element associated with conductivity modulation, the higher is the frequency, the shorter is the time. In general, the time required for conductivity modulation to be performed sufficiently is at least 50 μs and the higher is the frequency, the greater are the above differences in capacitance, and the structure of the current sensing portion 1037a is disposed isolated from the main semiconductor device element 1042, whereby conductivity modulation of the current sensing portion 1037a takes time. As a result, characteristics are affected, whereby the current value detected by the current sensing portion 1037a is affected.

This is also the case for unipolar devices and while the current capacity becomes at least 10 A when a semiconductor device configured using SiC is incorporated, as a device unit, due to the flow of large current, parasitic dielectric components present therein directly affect transient characteristics of the current sensing portion 1037a. Up until now, low current has been used and the current has been increased in a range that does not result in problems, whereby due to displacement current during transition, the same design values are used for the main semiconductor device element 1042 and the current sensing portion 1037a, and the effects of this are also apparent on unipolar devices.

Therefore, in the MOSFET having the current sensing portion 1037a, when design thereof is identical to the design of the main semiconductor device element 1042, during switching, erroneous operation easily occurs during short-circuiting. Further, the current sensing portion 1037a is designed to be separate from the main semiconductor device element 1042 and therefore, in an IGBT, etc., conductivity modulation of the current sensing portion 1037a accompanying increases in frequency is insufficient and a phenomenon occurs in which the sensing voltage increases.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
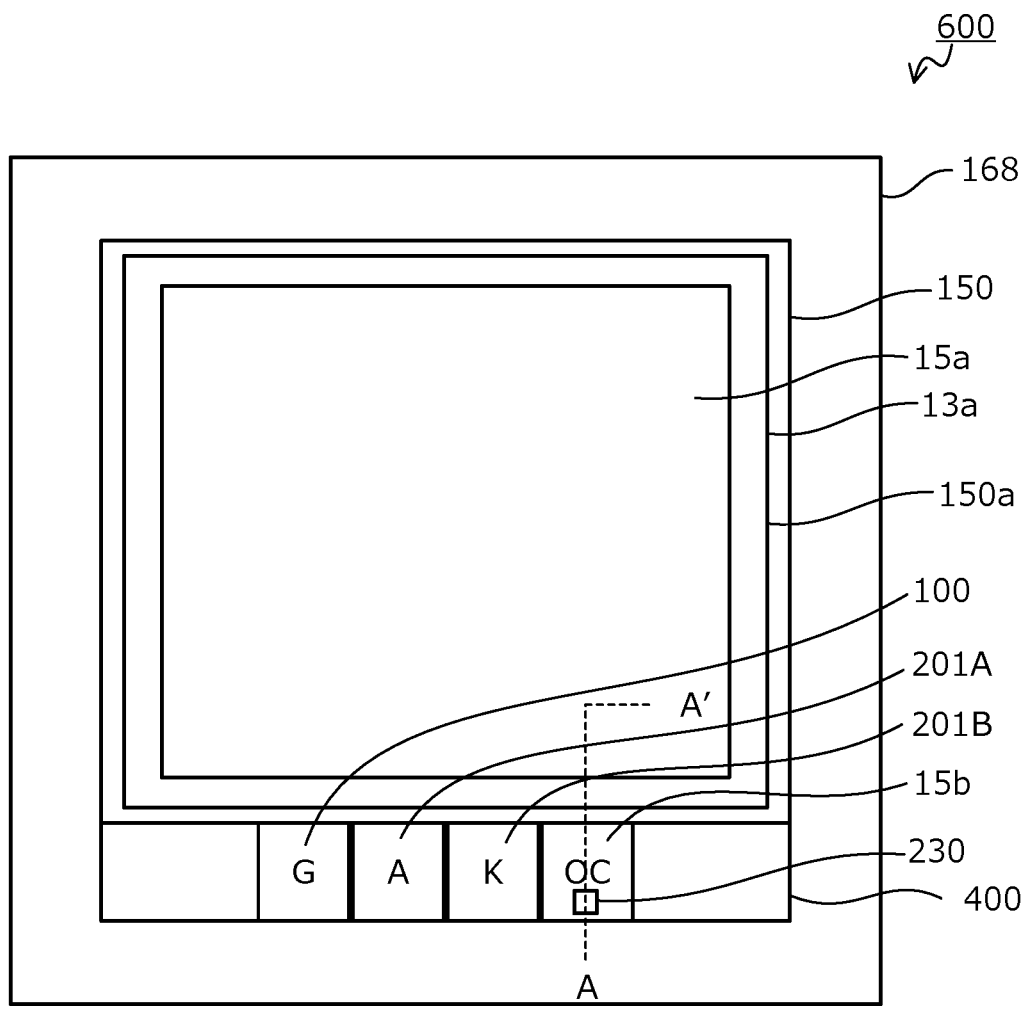
FIG. 1 is a top view of a structure of a silicon carbide semiconductor device according to an embodiment.

A semiconductor device according to an embodiment is configured using a semiconductor having a bandgap that is wider than that of silicon (Si) (hereinafter, wide bandgap semiconductor). A structure of the semiconductor device according to the embodiment is described, taking as an example, an instance in which, for example, silicon carbide (SiC) is used as a wide bandgap semiconductor. FIG. 1 is a top view of a structure of a silicon carbide semiconductor device according to the embodiment. FIG. 1 depicts a layout of regions and electrode pads of device elements disposed on a semiconductor substrate (semiconductor chip).

A silicon carbide semiconductor device 600 depicted in FIG. 1 has, on a single semiconductor substrate containing silicon carbide, a main semiconductor device element and high function portions such as, for example, a current sensing portion, a temperature sensing portion (not depicted), an over-voltage protecting portion (not depicted), and an arithmetic circuit portion (not depicted) as circuit portions for protecting/controlling the main semiconductor device element. The main semiconductor device element is a trench-type MOSFET through which drift current flows in a vertical direction (depth direction z of the semiconductor substrate) during an ON state and is configured by unit cells (functional units, not depicted) disposed adjacent to one another, the main semiconductor device element performs a main operation.

The main semiconductor device element is provided in an effective region (region functioning as a MOS gate) 150a of an active region 150. The effective region 150a of the active region 150 is a region through which a main current flows when the main semiconductor device element is ON. In the effective region 150a of the active region 150, first source electrodes 13a of the main semiconductor device element are provided on a front surface of the semiconductor substrate. The first source electrodes 13a, for example, cover substantially an entire area of the effective region 150a of the active region 150. Further, on front surfaces of the first source electrodes 13a, for example, a first source electrode pad 15a having a substantially rectangular shape in a plan view thereof is provided.

An edge termination region 168 is a region between the active region 150 and edges of the chip (semiconductor substrate) and is a region for mitigating electric field of a front side of the semiconductor substrate and sustaining breakdown voltage (withstand voltage). In the edge termination region 168, for example, a voltage withstanding structure (not depicted) such as a p-type region configuring a guard ring or a junction termination extension (JTE) structure, a field plate, a RESURF, etc. is disposed.

Further, at the active region 150, a high-function region 400 is provided adjacent to the active region 150. The high-function region 400 has, for example, a substantially rectangular shape in a plan view thereof. In the high-function region 400, high function portions such as a current sensing portion, an over-voltage protecting portion (not depicted), and an arithmetic circuit portion (not depicted) are provided. In FIG. 1, while only a current sensing portion is depicted as a high function portion, high function portions other than a current sensing portion may be disposed in the high-function region 400.

The current sensing portion has a function of detecting overcurrent (OC) flowing in the main semiconductor device element. The current sensing portion is provided beneath (in the depth direction z of the semiconductor substrate) a second source electrode pad 15b of the current sensing portion and is a vertical MOSFET having, in an active region 230 of the current sensing portion, a few unit cells configured similarly to those of the main semiconductor device element.

Further, in the high-function region 400, on the front surface of the semiconductor substrate, along a border between the active region 150 and the edge termination region 168 and separate from the first source electrodes 13a and the edge termination region 168, a gate electrode pad 100 of the main semiconductor device element, an anode electrode pad 201A of the temperature sensing portion, a cathode electrode pad 201B of the temperature sensing portion, and the second source electrode pad 15b of the current sensing portion are provided in contact with one another. Each of these electrode pads, for example, has a substantially rectangular shape in a plan view thereof.

The temperature sensing portion has a function of detecting temperature. Therefore, the temperature sensing portion is provided in the effective region 150a of the active region 150. For example, in the temperature sensing portion, a diode formed by a p-type polysilicon layer (not depicted) and an n-type polysilicon layer (not depicted) is provided. Forward voltage Vf of this diode varies according to temperature and the higher is the temperature, the lower is the forward voltage Vf. Therefore, a relationship between temperature and the forward voltage Vf is obtained in advance and by measuring the forward voltage Vf of the diode during operation of the MOSFET in the effective region 150a, the temperature of the silicon carbide semiconductor device 600 may be measured. The gate electrode pad 100 is electrically connected to first gate electrodes 10a of all of the unit cells of the main semiconductor device element, via a gate wiring electrode (not depicted).

Figure 2:
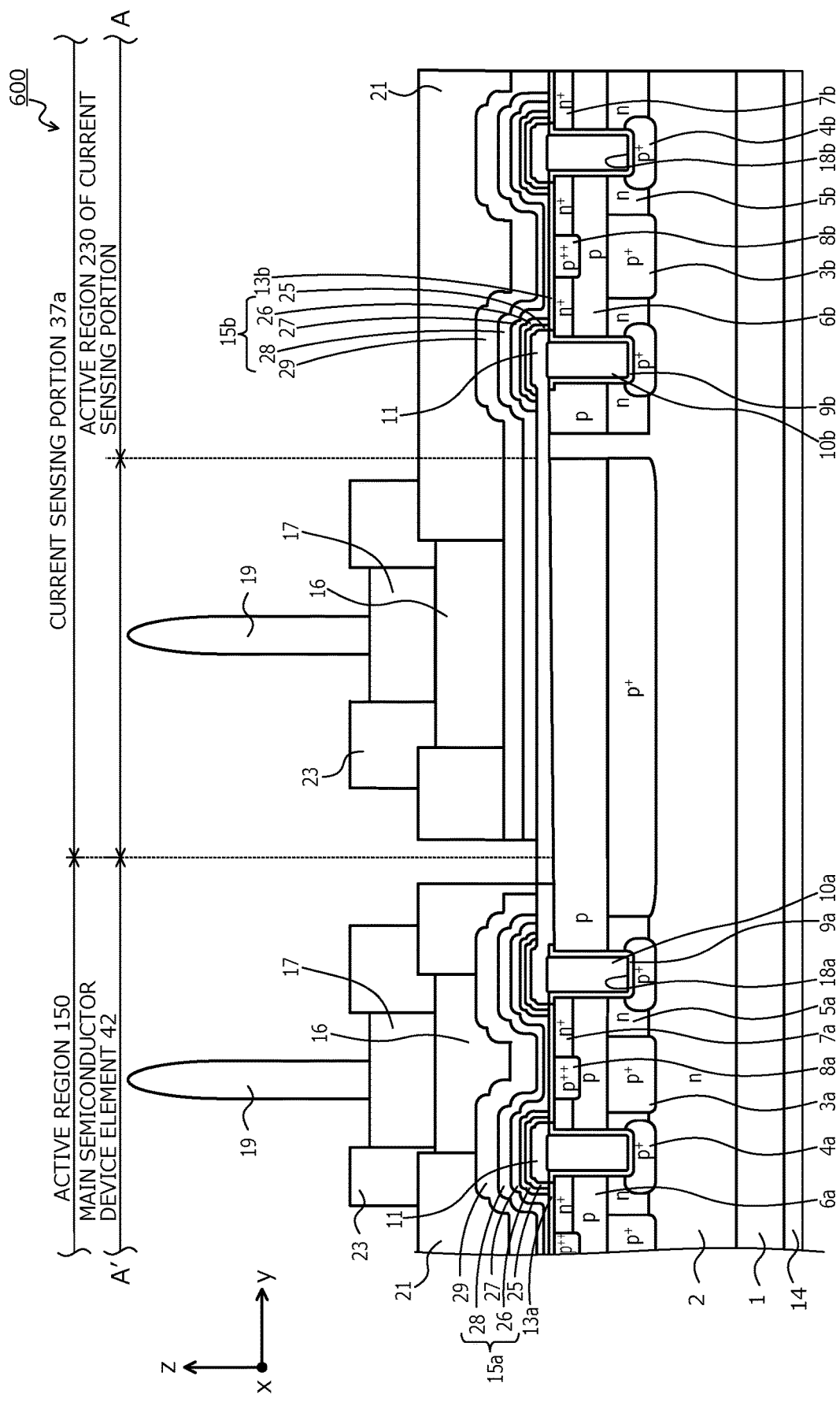
FIG. 2 is a cross-sectional view of the structure of the silicon carbide semiconductor device according to the embodiment depicted in FIG. 1.

Next, an example of a cross-sectional view of the structure of the above described active region 150 and a current sensing portion (second MOS structure portion) 37a is described. FIG. 2 is a cross-sectional view of the structure of the silicon carbide semiconductor device according to the embodiment depicted in FIG. 1. Only two adjacent unit cells of a main semiconductor device element (first MOS structure portion) 42 are depicted, while other unit cells of the main semiconductor device element, adjacent to these unit cells and closer to a chip (semiconductor substrate) center are not depicted.

The main semiconductor device element 42 is a trench-type MOSFET having MOS gates that have a trench-gate structure, on a front side of the semiconductor substrate (side thereof having a first p-type base layer 6a). In the trench-type MOSFET, an n-type silicon carbide epitaxial layer (first semiconductor layer of a first conductivity type) 2 is deposited on a first main surface (front surface), for example, a (0001) plane (Si-face), of an $n^+$-type silicon carbide substrate (semiconductor substrate of the first conductivity type) 1. The $n^+$-type silicon carbide substrate 1 is a silicon carbide single crystal substrate doped with, for example, nitrogen (N). The n-type silicon carbide epitaxial layer 2 is a low-concentration n-type drift layer doped with, for example, nitrogen at an impurity concentration lower than an impurity concentration of the $n^+$-type silicon carbide substrate 1.

As depicted in FIG. 2, a back electrode (second electrode) 14 is provided on a second main surface (back surface, i.e., back surface of a silicon carbide semiconductor base) of the $n^+$-type silicon carbide substrate 1. The back electrode 14 configures a drain electrode. On a surface of the back electrode 14, a drain electrode pad (not depicted) is provided.

As depicted in FIG. 2, in the main semiconductor device element 42, first n-type high-concentration regions 5a may be provided in the n-type silicon carbide epitaxial layer 2, at a first surface thereof that is opposite a second surface thereof that faces the $n^+$-type silicon carbide substrate 1. The first n-type high-concentration regions 5a are a high-concentration n-type drift layer having an impurity concentration that is lower than the impurity concentration of the $n^+$-type silicon carbide substrate 1 and higher than the impurity concentration of the n-type silicon carbide epitaxial layer 2.

On first surfaces of the first n-type high-concentration regions 5a (in an instance in which the first n-type high-concentration regions 5a are not provided, the n-type silicon carbide epitaxial layer 2, hereinafter, simply "(2)"), a first p-type base layer (first second-semiconductor-layer of a second conductivity type) 6a is provided, the first surfaces of the first n-type high-concentration regions 5a being opposite second surfaces thereof that face the $n^+$-type silicon carbide substrate 1. Hereinafter, the $n^+$-type silicon carbide substrate 1, the n-type silicon carbide epitaxial layer 2, and the first p-type base layer 6a are collectively the silicon carbide semiconductor base.

In the silicon carbide semiconductor base, at a first main surface (first surface of the first p-type base layer 6a) thereof, a trench structure is provided in a striped pattern. In particular, first trenches (first trenches) 18a penetrate through the first p-type base layer 6a from the first surface of the first p-type base layer 6a (first main surface of the silicon carbide semiconductor base) opposite a second surface of the first p-type base layer 6a facing the $n^+$-type silicon carbide substrate 1, and reach the first n-type high-concentration regions 5a(2). Along inner walls of the first trenches 18a, first gate insulating films (first gate insulating films) 9a are formed at bottoms and sidewalls of the first trenches 18a, and stripe-shaped first gate electrodes (first gate electrodes) 10a are formed on the first gate insulating films 9a in the first trenches 18a. The first gate electrodes 10a are insulated from the first n-type high-concentration regions 5a and the first p-type base layer 6a by the first gate insulating films 9a. A portion of each of the first gate electrodes 10a protrudes from a top of each of the first trenches 18a toward the first source electrode pad 15a described hereinafter.

In surface layers of the first n-type high-concentration regions 5a(2), at the first surfaces (first main surface of the silicon carbide semiconductor base) thereof opposite the second surfaces thereof facing the $n^+$-type silicon carbide substrate 1, first first-$p^+$-type-base-regions (first third-semiconductor-regions of the second conductivity type) 3a may be selectively provided. First second-$p^+$-type-base-regions (first second-semiconductor-regions of the second conductivity type) 4a may be provided beneath the first trenches 18a, a width of the first second-$p^+$-type-base-regions 4a being wider than a width the first trenches 18a. The first first-$p^+$-type-base-regions 3a and the first second-$p^+$-type-base-regions 4a, for example, are doped with aluminum.

Portions of the first first-$p^+$-type-base-regions 3a extend toward the first trenches 18a, whereby the first second-$p^+$-type-base-regions 4a are structured to be connected to the first first-$p^+$-type-base-regions 3a. The portions of the first first-$p^+$-type-base-regions 3a may have a planar layout in which the portions are disposed to repeatedly alternate with the first n-type high-concentration regions 5a(2) along a direction (hereinafter, second direction) x orthogonal to a direction (hereinafter, first direction) y along which the first first-$p^+$-type-base-regions 3a and the first second-$p^+$-type-base-regions 4a are arranged. For example, connecting regions where the portions of the first first-$p^+$-type-base-regions 3a extend toward both of the first trenches 18a along the first direction y may be provided, and a structure connected to the first second-$p^+$-type-base-regions 4a may be periodically disposed along the second direction x. A reason for this is that holes generated when avalanche breakdown occurs at bonded portions of the first second-$p^+$-type-base-regions 4a and the n-type silicon carbide epitaxial layer 2 are efficiently migrated to the first source electrodes 13a, whereby load to the first gate insulating films 9a is reduced and reliability is increased. For example, the first first-$p^+$-type-base-regions 3a, the connecting regions, the first second-$p^+$-type-base-regions 4a, as a whole, may form a grid-like shape in a plan view.

In the first p-type base layer 6a, at the first main surface of the silicon carbide semiconductor base, first $n^+$-type source regions (first first-semiconductor regions of the first conductivity type) 7a are selectively provided. Further, first $p^{++}$-type contact regions 8a may be provided. The first $n^+$-type source regions 7a are in contact with the first trenches 18a. Further, the first $n^+$-type source regions 7a and the first $p^{++}$-type contact regions 8a are in contact with one another.

An interlayer insulating film 11 is provided in an entire area of the first main surface of the silicon carbide semiconductor base so as to cover the first gate electrodes 10a embedded in the first trenches 18a. The first source electrodes (first first-electrodes) 13a are in contact with the first $n^+$-type source regions 7a and the first p-type base layer 6a via contact holes opened in the interlayer insulating film 11. In an instance in which the first $p^{++}$-type contact regions 8a are provided, contact is with the first $n^+$-type source regions 7a and the first $p^{++}$-type contact regions 8a. The first source electrodes 13a, for example, are formed by a NiSi film. The contact holes opened in the interlayer insulating film 11 have a stripe shape corresponding to the shape of the first gate electrodes 10a. The first source electrodes 13a are electrically insulated from the first gate electrodes 10a by the interlayer insulating film 11. On the first source electrodes 13a, the first source electrode pad 15a is provided. The first source electrode pad 15a, for example, is formed by a first TiN film 25, a first Ti film 26, a second TiN film 27, a second Ti film 28, and an Al alloy film 29 stacked on one another. Between the first source electrodes 13a and the interlayer insulating film 11, for example, a barrier metal (not depicted) that prevents diffusion of metal atoms from the first source electrodes 13a to the first gate electrodes 10a may be provided.

On a top of the first source electrode pad 15a, plating films 16 are selectively provided and a solder 17 is selectively provided on surfaces of the plating films 16. In the solder 17, external terminal electrodes 19 that are a wiring material that leads out potential of the first source electrodes 13a are provided. The external terminal electrodes 19 have a needle-like pin-shape and are bonded to the first source electrode pad 15a in an upright state.

Portions of the surface of the first source electrode pad 15a other than the plating films 16 are covered by the first protective films 21. In particular, the first protective films 21 are provided so as to cover the first source electrode pad 15a and in openings of the first protective films 21, the external terminal electrodes 19 are bonded via the plating films 16 and the solder 17. A border between the plating films 16 and the first protective films 21 is covered by second protective films 23. The first protective films 21 and the second protective films 23, for example, are polyimide films.

Further, the active region 230 of the current sensing portion has a structure similar to that of the main semiconductor device element 42. The current sensing portion 37a includes a second p-type base layer (second second-semiconductor-layer of the second conductivity type) 6b, second n$^+$-type source regions (second first-semiconductor-regions of the first conductivity type) 7b, second p$^{++}$-type contact regions 8b, second trenches (second trenches) 18b, second gate insulating films (second gate insulating films) 9b, second gate electrodes (second gate electrodes) 10b, and the interlayer insulating film 11. Components of the MOS gates of the current sensing portion are provided in the high-function region 400.

In the active region 230 of the current sensing portion as well, similarly to the main semiconductor device element 42, the second p$^{++}$-type contact regions 8b may be omitted. The active region 230 of the current sensing portion may have second n-type high-concentration regions 5b, similarly to the main semiconductor device element 42. Further, the active region 230 of the current sensing portion may have second first-p$^+$-type-base-regions (second third-semiconductor-regions) 3b and second second-p$^+$-type-base-regions (second second-semiconductor-regions) 4b, similarly to the main semiconductor device element 42. Furthermore, the active region 230 of the current sensing portion has second source electrodes (second first-electrodes) 13b having a structure similar to those of the main semiconductor device element 42, and on the second source electrodes 13b, a second source electrode pad 15b having a structure similar to that of the first source electrode pad 15a of the main semiconductor device element 42 is provided. On the second source electrode pad 15b, a structure is similar to that on top of the first source electrode pad 15a of the main semiconductor device element 42.

Here, structures formed by the first and the second n$^+$-type source regions 7a, 7b and the first and the second gate insulating films 9a, 9b configuring the MOS gates are regarded as basic units, and a structure in contact with any of the basic units or surrounding any thereof is regarded as an interface portion. The basic units include first basic units of the main semiconductor device element 42, and second basic units of the current sensing portion 37a. The interface portion includes a first interface portion and a second interface portion. The first interface portion (first portion) is, for example, the n$^+$-type silicon carbide substrate 1, the n-type silicon carbide epitaxial layer 2, the first first-p$^+$-type-base-regions 3a, the first second-p$^+$-type-base-regions 4a, the first n-type high-concentration regions 5a, the first second p-type base layer 6a, the first n$^+$-type source regions 7a, the first p$^{++}$type contact regions 8a, the first gate insulating films 9a, the first gate electrodes 10a, the interlayer insulating film 11, the first source electrodes 13a, etc.; however, is not limited hereto. The second interface portion (second portion) is, for example, the n$^+$-type silicon carbide substrate 1, the n-type silicon carbide epitaxial layer 2, the second first-p$^+$-type-base-regions 3b, the second second-p$^+$-type-base-regions 4b, the second n-type high-concentration regions 5b, the second p-type base layer 6b, the second n$^+$-type source regions 7b, the second p$^{++}$type contact regions 8b, the second gate insulating films 9b, the second gate electrodes 10b, the interlayer insulating film 11, etc.; however, is not limited hereto.

In the embodiment, structures differ by the first interface portion (first portion) in contact with or surrounding any of the basic units of the main semiconductor device element 42 and the second interface portion (second portion) in contact with or surrounding any of the basic units of the current sensing portion 37a so that the main semiconductor device element 42 has a MOS characteristic different from a MOS characteristic of the current sensing portion 37a the second MOS structure.

The structures differ when, for example, a width, a thickness, or an interval of at least a layer or a region included in the first interface portion differs from a width, a thickness, or an interval of a functionally corresponding layer or region of the second interface portion by at least 10%. The corresponding layer or region of the second interface portion is a layer or region of the second interface portion having a function similar to that of said layer or region included in the first interface portion. For example, regions of the second interface portion corresponding to the first first-p$^+$-type-base-regions 3a included in the first interface portion are the second first-p$^+$-type-base-regions 3b.

Figure 3:
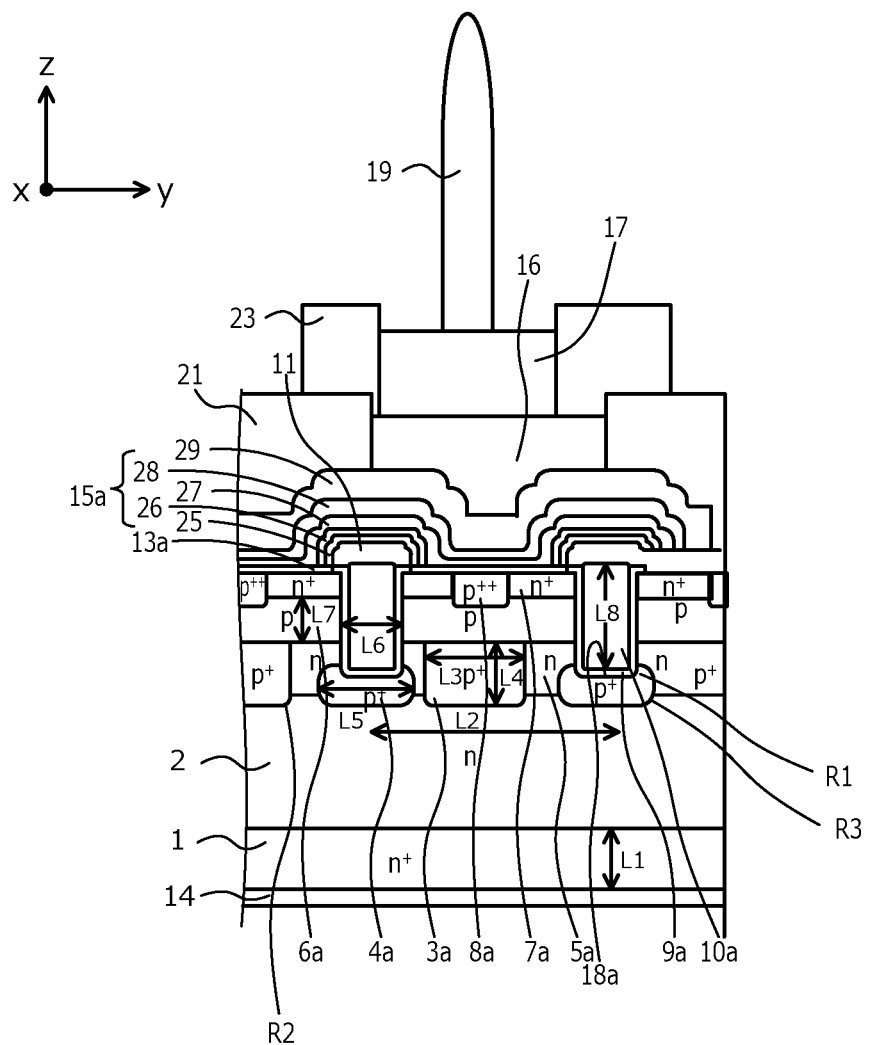
FIG. 3 is a cross-sectional view depicting various dimensions of the silicon carbide semiconductor device according to the embodiment.
Figure 4:
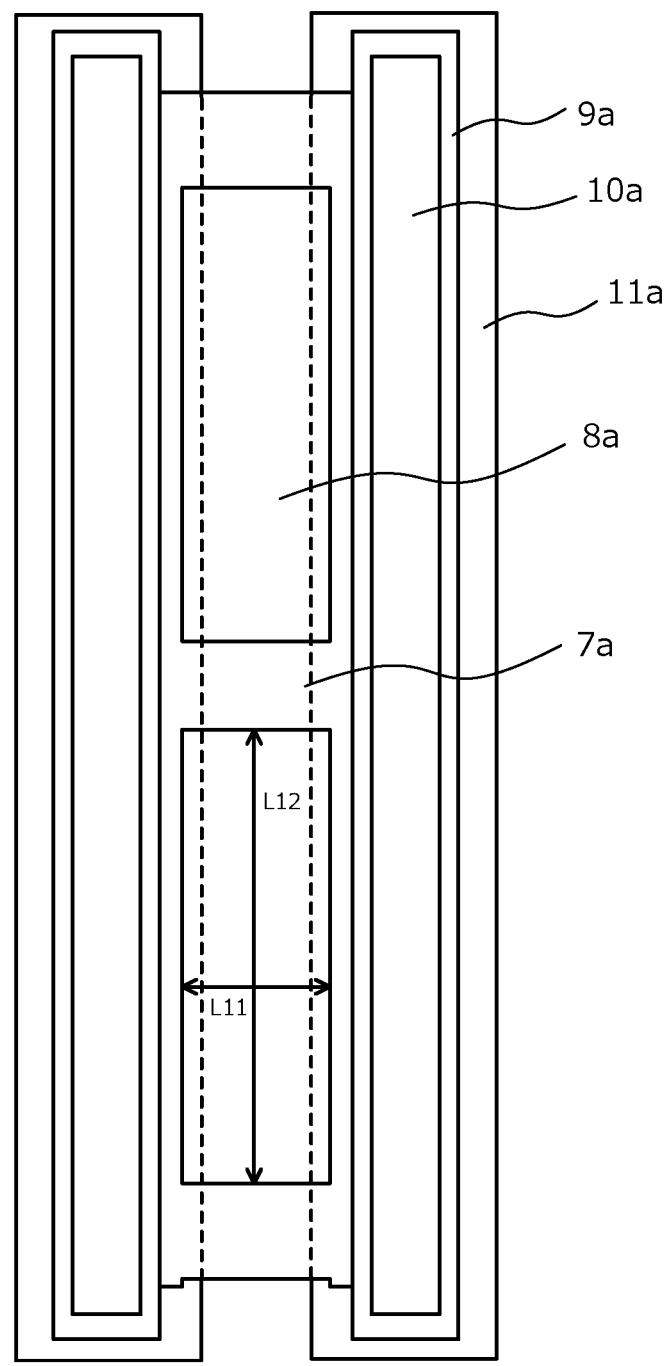
FIG. 4 is a plan view depicting various dimensions of the silicon carbide semiconductor device according to the embodiment.

Herein, FIG. 3 is a cross-sectional view depicting various dimensions of the silicon carbide semiconductor device according to the embodiment. Further, FIG. 4 is a plan view depicting various dimensions of the silicon carbide semiconductor device according to the embodiment. The main semiconductor device element 42 and the active region 230 of the current sensing portion have structures similar to each other and therefore, hereinafter, in FIGS. 3 to 5, only the structure of the main semiconductor device element 42 is depicted.

A width of a layer or a region is a length of said layer or region along an x-axis direction (direction in which the first and the second trenches 18a, 18b having a stripe shape are arranged) or a y-axis direction (direction in which the first and the second trenches 18a, 18b having the stripe shape extend in the stripe shape). For example, in FIG. 3, L3 indicates the width of each of the first first-p$^+$-type-base-regions 3a, L5 indicates the width of each of the first second-p$^+$-type-base-regions 4a, and L6 indicates the width of each of the first trenches 18a. Further, in FIG. 4, L11 indicates the width of each of the first p$^{++}$-type contact regions 8a along the y-axis direction and L12 indicates the width of each of the first p$^{++}$-type contact regions 8a along the x-axis direction.

A thickness of a layer or a region is a length of said layer or region in a z-axis direction (direction extending from the back electrode 14 to the first and the second source electrodes 13a, 13b). For example, in FIG. 3, L1 indicates the thickness of the n$^+$-type silicon carbide substrate 1, L4 indicates the thickness of each of the first first-p$^+$-type-base-regions 3a, L7 indicates the thickness of the first p-type base layer 6a, and L8 indicates the thickness of each of the first trenches 18a. An interval of a layer or a region is a distance between said layer or region. For example, in FIG. 3, L2 indicates the interval between the first trenches 18a (cell pitch).

Further, "differing by at least 10%" is when the width, the thickness, or the interval of at least a layer or a region included in the first interface portion is at least 1.1 times or at most 0.9 times the width, the thickness, or the interval of the corresponding layer or region included in the second interface portion. For example, in an instance in which the width of each of the second first-$p^+$-type-base-regions 3b is assumed to be L3', then, L3/L3'≥1 or L3/L3'≤0.9. Here, while L3, L3' are given as an example, this similar for other widths, thicknesses, and intervals. Here, the widths, thicknesses, and intervals depicted in FIGS. 3 and 4 are merely examples, widths, thicknesses, and intervals of other layers and regions included in the interface portions are further included in the invention according to the embodiment.

Moreover, the structures also differ, for example, when a level or a material of at least a layer or a region included in the first interface portion differs from a level or material of the functionally corresponding layer or region of the second interface portion. Whether a lifetime killer, etc. is included in a layer and region corresponds to materials differing. The level of a layer or region (each element) may be defined by a total number of layers and regions disposed between the semiconductor substrate 1 and the layer or region. For example, the total number of layers or regions between the $n^+$-type silicon carbide substrate 1 and the first n-type high-concentration regions 5a is one (the n-type silicon carbide epitaxial layer 2). The total number of layers or regions between the $n^+$-type silicon carbide substrate 1 and the second n-type high-concentration regions 5b is one (the n-type silicon carbide epitaxial layer 2). Thus, the level of the first n-type high-concentration regions 5a and the level of the second n-type high-concentration regions 5b are the same in this embodiment.

Moreover, the structures also differ, for example, when an impurity concentration of at least a layer or a region included in the first interface portion differs by at least 10% from an impurity concentration of a corresponding layer or region of the second interface portion.

Moreover, the structures differ, for example, when a radius of curvature of a corner portion of at least a layer or a region included in the first interface portion differs by at least 10% from a radius of curvature of a corner portion of a corresponding layer or region of the second interface portion. For example, a radius of curvature R1 of a corner portion of each of the first trenches 18a, the corner portion facing the back electrode 14, differs by at least 10% from a radius of curvature of a corner portion of each of the second trenches 18b, the corner portion facing the back electrode 14. Further, for example, a radius of curvature R2 of a corner portion of each of the first first-$p^+$-type-base-regions 3a, the corner portion facing the back electrode 14 differs by at least 10% from a radius of curvature a corner portion of each of the second first-$p^+$-type-base-regions 3b, the corner portion facing the back electrode 14. Further, a radius of curvature R3 of a corner portion of each of the first second-$p^+$-type-base-regions 4a, the corner portion facing the back electrode 14 differs by at least 10% from a radius of curvature of a corner portion of each of the second second-$p^+$-type-base-regions 4b, the corner portion facing the back electrode 14.

Figure 5:
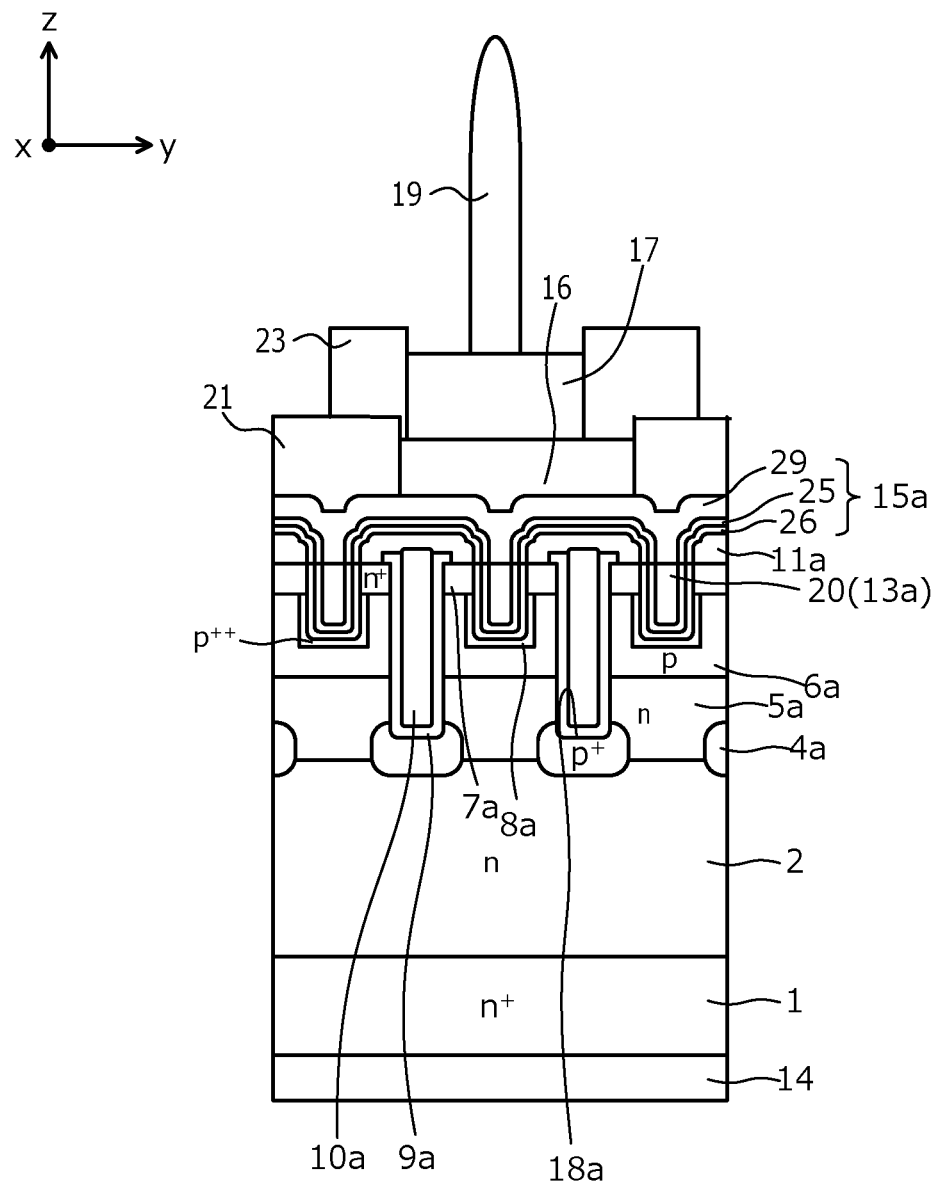
FIG. 5 is a cross-sectional view of another structure of the silicon carbide semiconductor device according to the embodiment.

Here, FIG. 5 is a cross-sectional view of another structure of the silicon carbide semiconductor device according to the embodiment. In the silicon carbide semiconductor device depicted in FIG. 5, the first source electrodes 13a each having a trench structure are provided between the first trenches 18a, and in each trench of the first source electrodes 13a, a tungsten plug 20 is embedded. Further, in the silicon carbide semiconductor device depicted in FIG. 5, the first source electrode pad 15a has a three-layered structure including the first Ti film 26, the first TiN film 25, and the Al alloy film 29.

Also in the silicon carbide semiconductor device depicted in FIG. 5, similarly to the silicon carbide semiconductor device depicted in FIG. 3, levels or materials of layers or regions, or widths, thicknesses or impurity concentrations of layers or regions are set to differ, thereby enabling the structures to differ by the first interface portion and the second interface portion.

In the embodiment, the structure of the second interface portion may be set to differ from the structure of the first interface portion by setting the structure of the main semiconductor device element 42 as the structure depicted in FIG. 3 and setting the structure of the current sensing portion 37a as the structure depicted in FIG. 5. Conversely, the structure of the main semiconductor device element 42 may be set as the structure depicted in FIG. 5 and the structure of the current sensing portion 37a may be set as the structure depicted in FIG. 3.

Moreover, the structures differ when shapes of the MOS structures differ. For example, the MOS structure of the main semiconductor device element 42 has a trench shape while that of the current sensing portion 37a has a planar shape. Conversely, the MOS structure of the main semiconductor device element 42 has a planar shape while that of the current sensing portion 37a has a trench shape.

In this manner, the structures are set to differ by the first interface portion and the second interface portion, whereby values of characteristics of the main semiconductor device element 42 and values of characteristics of the current sensing portion 37a differ. For example, preferably, the values of the characteristics of the main semiconductor device element 42 and the values of the characteristics of the current sensing portion 37a may differ by at least 10%.

For example, in the embodiment, the structures differ by the first interface portion and the second interface portion, whereby a rate of change of drain-source current with respect to drain-source voltage of the main semiconductor device element 42 is at least 10% higher than the rate of change of the drain-source current with respect to drain-source voltage of the current sensing portion 37a.

As described above, use is via sensing resistance (not depicted) between the earth potential and the source electrodes of the current sensing portion 37a. In this instance, due to the sensing resistance, the drain-source current with respect to the drain-source voltage of the current sensing portion 37a is lower than the rate of change of the drain-source current with respect to the drain-source voltage of the main semiconductor device element 42. As a result, even when the drain-source current is measured at the current sensing portion 37a, it may be detected to be lower than the drain-source current of the main semiconductor device element 42. Therefore, overcurrent flowing in the main semiconductor device element 42 cannot be detected and the semiconductor device element may be destroyed.

In contrast, in the embodiment, the rate of change of the drain-source current with respect to the drain-source voltage of the current sensing portion 37a is set to be at least 10% higher than the rate of change of the drain-source current with respect to the drain-source voltage of the main semiconductor device element 42. As a result, in an instance of use via the sensing resistance between the earth potential and the source electrodes of the current sensing portion 37a, characteristics of the current sensing portion 37a may be set to be similar to characteristics of the main semiconductor device element 42. Therefore, instances in which the drain-source current measured at the current sensing portion 37a is detected to be lower than the drain-source current of the main semiconductor device element 42 are eliminated and destruction of the semiconductor device element due to an inability to detect overcurrent flowing in the main semiconductor device element 42 may be prevented.

For example, factors that limit current include the resistance of the n$^+$-type silicon carbide substrate 1, the thickness of the n$^+$-type silicon carbide substrate 1, contact resistance of the back surface of the n$^+$-type silicon carbide substrate 1, a material of a contact electrode of the back surface of the n$^+$-type silicon carbide substrate 1, etc. For the basic unit, increase of a threshold value and thickness of the first and the second gate insulating films 9a, 9b enables the actual gate voltage to be reduced. Further, channel length may be increased, and the ON resistance may be increased. The area of contact portions of the first and the second p$^{++}$-type contact regions 8a, 8b, the shape of the first and the second source electrodes 13a, 13b, and the impurity concentrations of regions may be adjusted. By such modifications of values of characteristics, the rate of change of the drain-source current with respect to the drain-source voltage of the main semiconductor device element 42 may be set to be at least 10% higher than the rate of change of the drain-source current with respect to the drain-source voltage of the current sensing portion 37a. Additionally, JFET resistance due to pn junctions between the second first-p$^+$-type-base-regions 3b, the second second-p$^+$-type-base-regions 4b, the second p-type base layer 6b and the second n-type high-concentration regions 5b may be set to differ by at least 10%. Further, drift resistance due to pn junctions between the second first-p$^+$-type-base-regions 3b, the second second-p$^+$-type-base-regions 4b and the n-type silicon carbide epitaxial layer 2 may be set to differ. Further, channel resistance may be changed by changing the concentration and/or thickness of the second p-type base layer 6b; the resistance of the plating films 16 may be changed by changing the thickness and/or composition of the plating films 16; and the cell pitch L2, the width L6, and/or the thickness L8 of the trench-gate structure may be changed.

Next, a method of manufacturing the silicon carbide semiconductor device according to the embodiment is described. FIGS. 6, 7, 8, 9, 10, and 11 are cross-sectional views of states of the silicon carbide semiconductor device according to the embodiment during manufacture.

Figure 6:
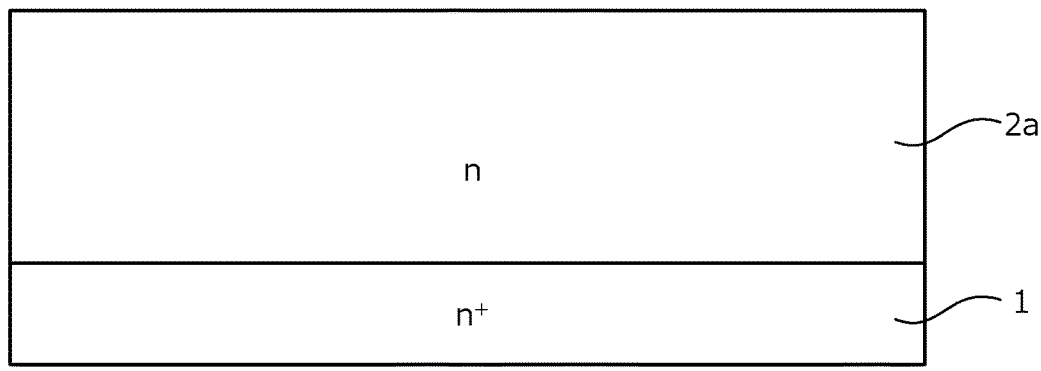
FIG. 6 is a cross-sectional views of a state of the silicon carbide semiconductor device according to the embodiment during manufacture.

First, the n$^+$-type silicon carbide substrate 1 containing an n-type silicon carbide is prepared. Subsequently, on the first main surface of the n$^+$-type silicon carbide substrate 1, a first n-type silicon carbide epitaxial layer 2a containing silicon carbide is epitaxially grown to have a thickness of, for example, about 30 μm while an n-type impurity, for example, nitrogen atoms (N) is doped. The state up to here is depicted in FIG. 6.

Next, on the surface of the first n-type silicon carbide epitaxial layer 2a, an ion implantation mask having predetermined openings is formed by a photolithographic technique using, for example, an oxide film. Subsequently, a p-type impurity such as aluminum is implanted in the openings of the oxide film, thereby forming lower first p$^+$-type base regions 3a' and the first second-p$^+$-type-base-regions 4a of a depth of about 0.5 μm.

Further, formation is such that a distance between one of the lower first p$^+$-type base regions 3a' and one of the first second-p$^+$-type-base-regions 4a adjacent thereto is about 1.5 μm. An impurity concentration of the lower first p$^+$-type base regions 3a' and the first second-p$^+$-type-base-regions 4a is set to be, for example, about $5\times10^{18}/cm^3$.

Figure 7:
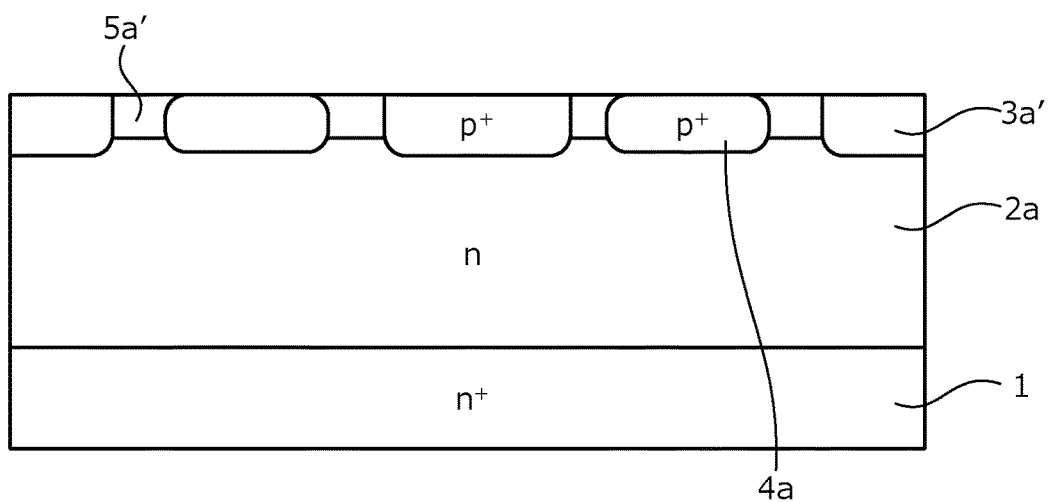
FIG. 7 is a cross-sectional views of a state of the silicon carbide semiconductor device according to the embodiment during manufacture.

Next, portions of the ion implantation mask may be removed, an n-type impurity such as nitrogen may be implanted in the openings of the oxide film, and lower n-type high-concentration regions 5a' of a depth of, for example, about 0.5 μm may be formed in surface regions of the first n-type silicon carbide epitaxial layer 2a. An impurity concentration of the lower n-type high-concentration regions 5a' is set to be, for example, about $1\times10^{17}/cm^3$. The state up to here is depicted in FIG. 7.

Next, on the surface of the first n-type silicon carbide epitaxial layer 2a, a second n-type silicon carbide epitaxial layer 2b doped with an n-type impurity such as nitrogen is formed having a thickness of about 0.5 μm. An impurity concentration of the second n-type silicon carbide epitaxial layer 2b is set to be about $3\times10^{15}/cm^3$. Hereinafter, the first n-type silicon carbide epitaxial layer 2a and the second n-type silicon carbide epitaxial layer 2b combined are the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film, thereby forming upper first p$^+$-type base regions 3b' of a depth of about 0.5 μm so as to overlap the lower first p$^+$-type base regions 3a', respectively. Regions connecting the lower first p$^+$-type base regions 3a' and the upper first p$^+$-type base regions 3b' are formed, thereby forming the first first-p$^+$-type-base-regions 3a. An impurity concentration of the upper first p$^+$-type base regions 3b' is set to be, for example, about $5\times10^{18}/cm^3$.

Figure 8:
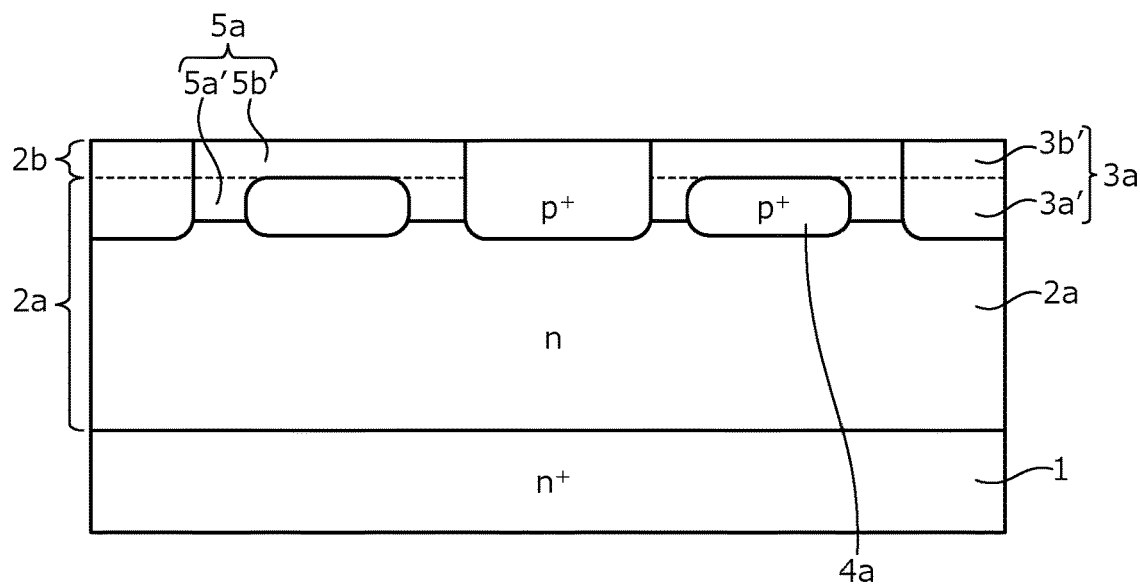
FIG. 8 is a cross-sectional views of a state of the silicon carbide semiconductor device according to the embodiment during manufacture.

Next, portions of the ion implantation mask may be removed, an n-type impurity such as nitrogen may be implanted in the openings of the oxide film, and in surface regions of the second n-type silicon carbide epitaxial layer 2b, upper n-type high-concentration regions 5b' of a depth of, for example, about 0.5 μm may be formed. An impurity concentration of the upper n-type high-concentration regions 5b' is set to be, for example, about $1\times10^{17}/cm^3$. The upper n-type high-concentration regions 5b' and the lower n-type high-concentration regions 5a' are formed to contact one another at least partially, whereby the first n-type high-concentration regions 5a are formed. Nonetheless, the first n-type high-concentration regions 5a may be formed in an entire area of the substrate surface or may be omitted. The state up to here is depicted in FIG. 8.

Next, on the surface of the n-type silicon carbide epitaxial layer 2, the first p-type base layer 6a is formed by epitaxial growth to have a thickness of about 1.1 μm. An impurity concentration of the first p-type base layer 6a is set to be about $4\times10^{17}/cm^3$. After formation of the first p-type base layer 6a by epitaxial growth, a p-type impurity such as aluminum may be further ion implanted in the first p-type base layer 6a.

Figure 9:
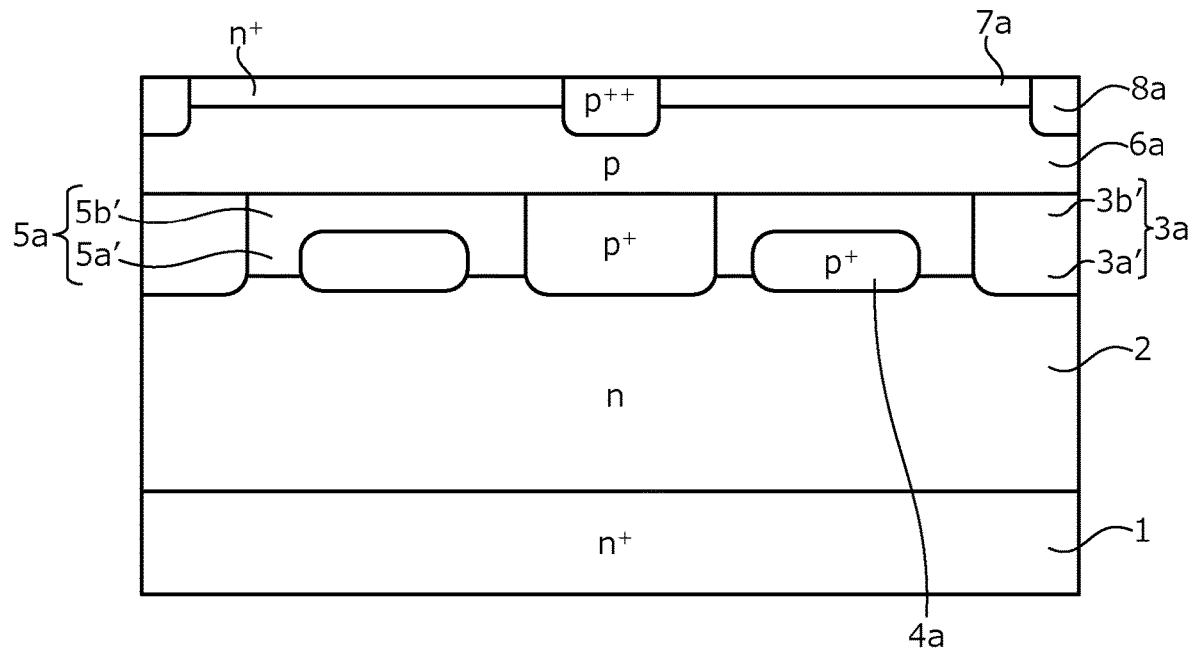
FIG. 9 is a cross-sectional views of a state of the silicon carbide semiconductor device according to the embodiment during manufacture.

Next, on the surface of the first p-type base layer 6a, an ion implantation mask having predetermined openings is formed by photolithography using, for example, an oxide film. In the openings, an n-type impurity such as nitrogen (N) or phosphorus (P) is ion implanted, thereby forming the first n$^+$-type source regions 7a in the first p-type base layer 6a, at the surface thereof. Next, the ion implantation mask used in forming the first n$^+$-type source regions 7a is removed and by a similar method, an ion implantation mask having predetermined openings may be formed, and a p-type impurity such as phosphorus may be ion implanted in the first p-type base layer 6a, whereby the first $p^{++}$-type contact regions 8a may be formed. An impurity concentration of the first $p^{++}$-type contact regions 8a is set to be higher than the impurity concentration of the first p-type base layer 6a. The state up to here is depicted in FIG. 9.

Next, a heat treatment (annealing) under an inert gas atmosphere of about 1700 degrees C. is performed, thereby implementing an activation process of the first first-$p^+$-type-base-regions 3a, the first second-$p^+$-type-base-regions 4a, the first $n^+$-type source regions 7a, and the first $p^{++}$-type contact regions 8a. As described above, ion implanted regions may be collectively activated by a single session of the heat treatment or the heat treatment for activation may be performed each time ion implantation is performed.

Figure 10:
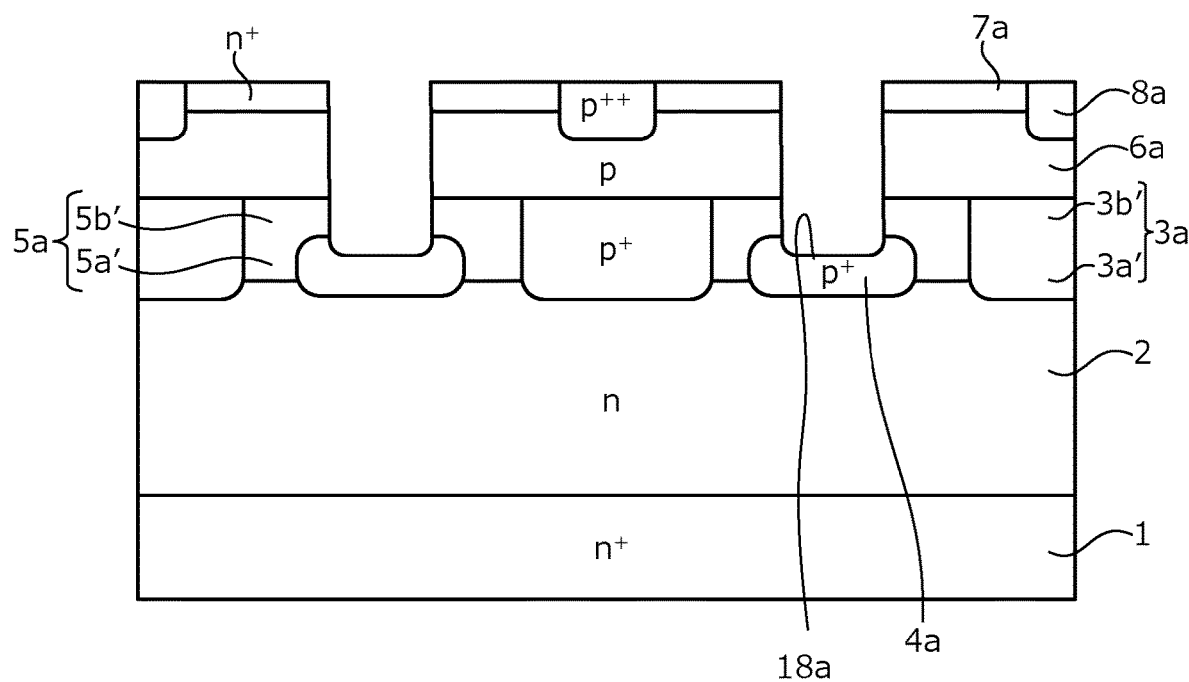
FIG. 10 is a cross-sectional views of a state of the silicon carbide semiconductor device according to the embodiment during manufacture.

Next, on the surface of the first p-type base layer 6a, a trench formation mask having predetermined openings is formed by photolithography using, for example, an oxide film. Next, the first trenches 18a that penetrate the first p-type base layer 6a and reach the first n-type high-concentration regions 5a(2) are formed by dry etching. Bottoms of the first trenches 18a may respectively reach the first second-$p^+$-type-base-regions 4a formed in the first n-type high-concentration regions 5a(2). Next, the trench formation mask is removed. The state up to here is depicted in FIG. 10.

Next, along the surfaces of the first $n^+$-type source regions 7a and along the bottoms and sidewalls of the first trenches 18a, the first gate insulating films 9a are formed. The first gate insulating films 9a may be formed by thermal oxidation of a temperature of about 1000 degrees C. in an oxygen atmosphere. Further, the first gate insulating films 9a may be formed by a deposition method by a chemical reaction such as that for a high temperature oxide (HTO).

Next, on the first gate insulating films 9a, a polycrystalline silicon layer doped with, for example, phosphorus atoms is provided. The polycrystalline silicon layer may be formed so as to be embedded in the first trenches 18a. The polycrystalline silicon layer is patterned by photolithography to be left in the first trenches 18a, whereby the first gate electrodes 10a are formed.

Figure 11:
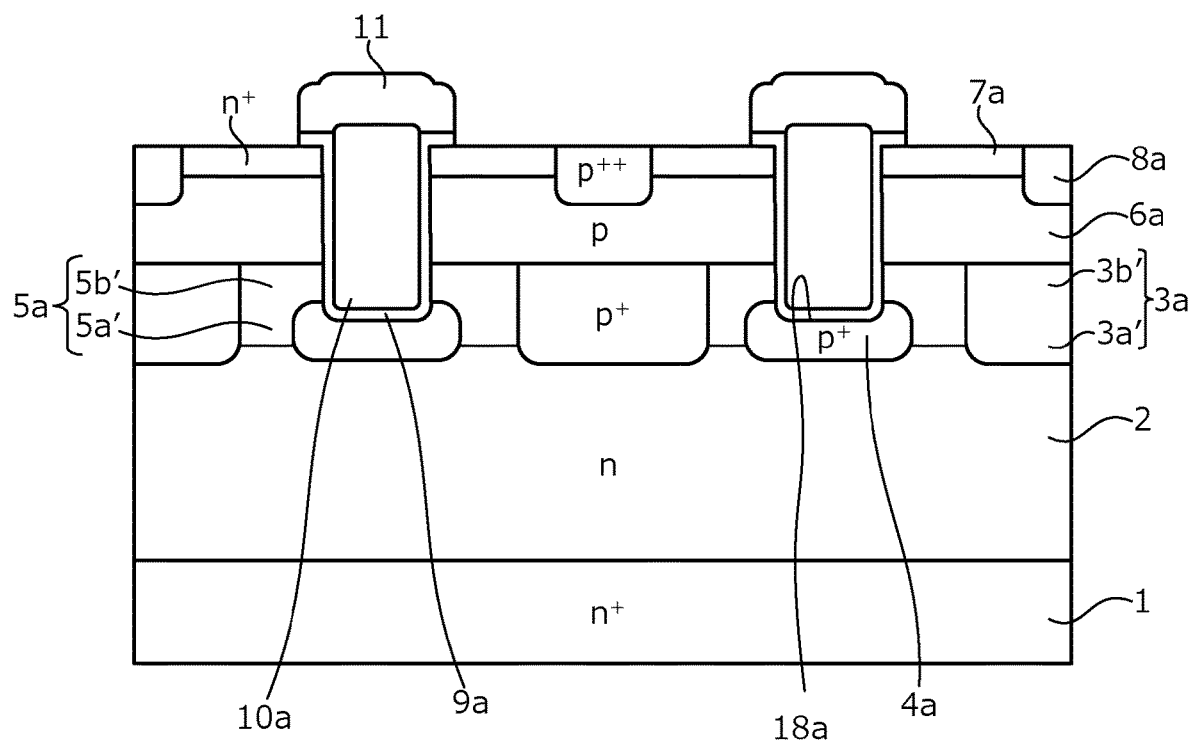
FIG. 11 is a cross-sectional views of a state of the silicon carbide semiconductor device according to the embodiment during manufacture.
Figure 12:
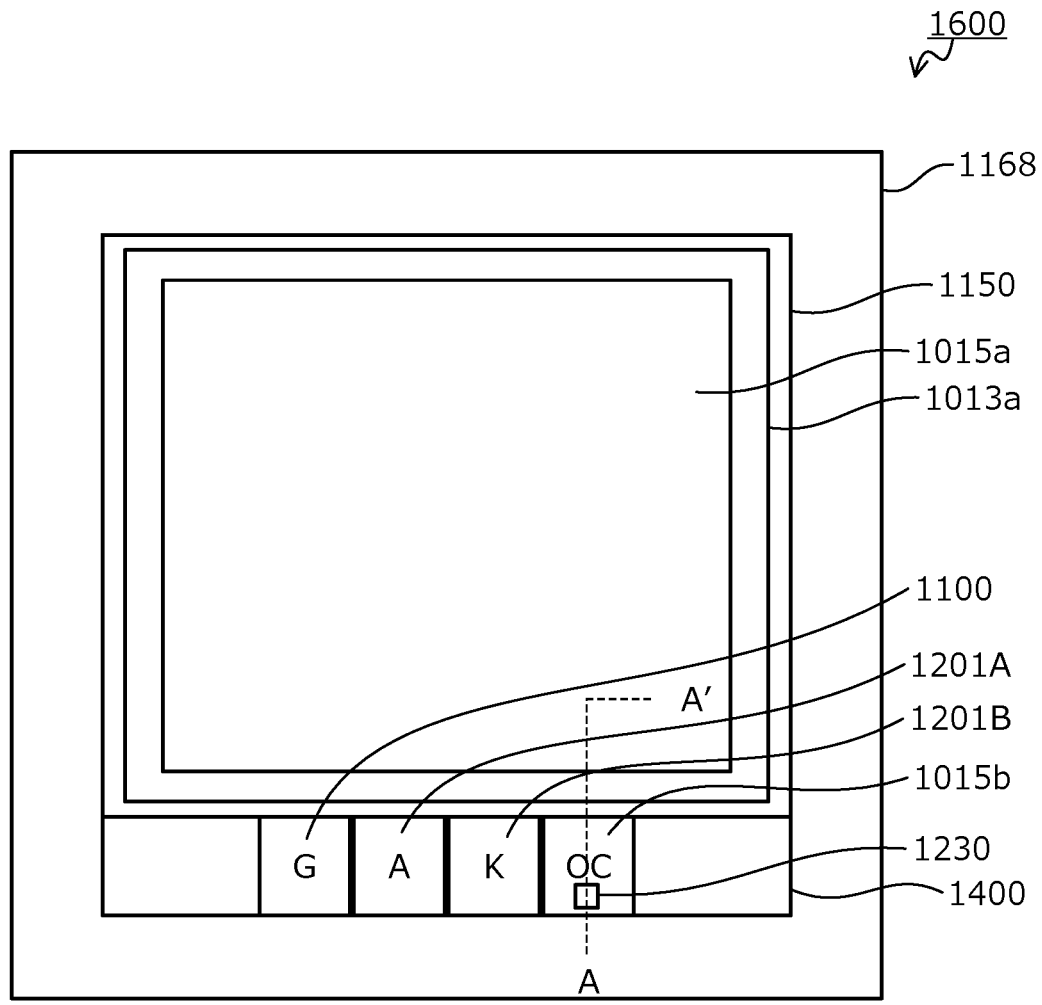
FIG. 12 is a top view of a structure of a conventional silicon carbide semiconductor device.
Figure 13:
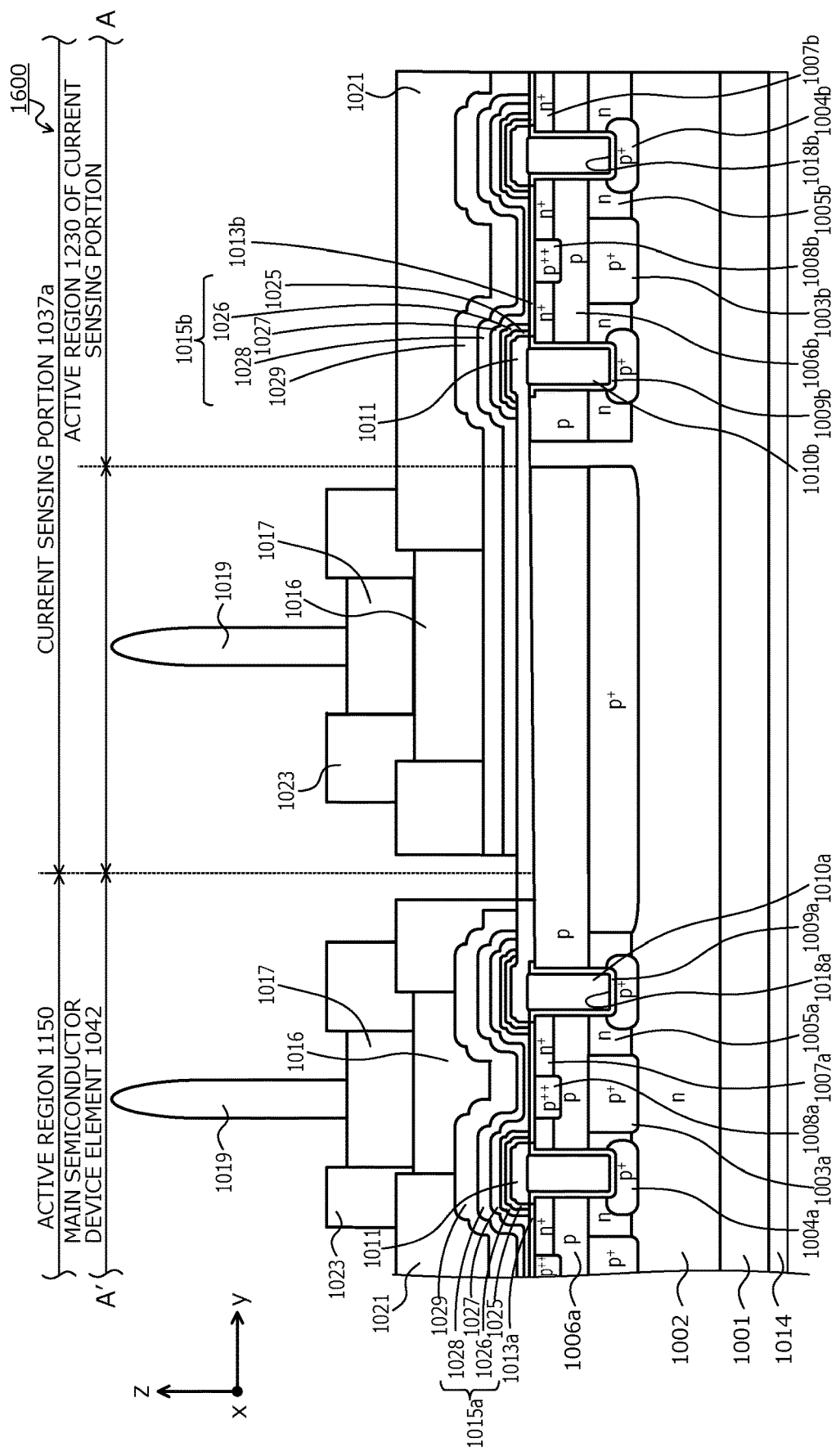
FIG. 13 is a cross-sectional view of the structure of the conventional silicon carbide semiconductor device along cutting line A-A' in FIG. 12.

Next, for example, a phosphate glass is deposited so as to cover the first gate insulating films 9a and the first gate electrodes 10a and have a thickness of about 1 μm, whereby the interlayer insulating film 11 is formed. Next, a barrier metal containing titanium (Ti) or titanium nitride (TiN) or stacked layers of titanium and titanium nitride may be formed so as to cover the interlayer insulating film 11. The interlayer insulating film 11 and the first gate insulating films 9a are patterned by photolithography, thereby forming contact holes that expose the first $n^+$-type source regions 7a and the first $p^{++}$-type contact regions 8a. Thereafter, a heat treatment (reflow) is performed, whereby the interlayer insulating film 11 is planarized. The state up to here is depicted in FIG. 11. Further, after formation of the contact holes in the interlayer insulating film 11, a barrier metal containing titanium (Ti) or titanium nitride (TiN) or stacked layers of titanium and titanium nitride may be formed. In this instance, in the barrier metal as well, contact holes exposing the first $n^+$-type source regions 7a and the first $p^{++}$-type contact regions 8a are formed.

Next, on the interlayer insulating film 11 and in the contact holes provided in the interlayer insulating film 11, a conductive film that becomes the first source electrodes 13a is formed. The conductive film is, for example, a nickel (Ni) film. Further, on the second main surface of the $n^+$-type silicon carbide substrate 1, nickel (Ni) film is similarly formed. Thereafter, a heat treatment of a temperature of, for example, about 970 degrees C. is performed, thereby converting the nickel film in the contact holes into a silicide, whereby the first source electrodes 13a are formed. Concurrently, the nickel film formed on the second main surface becomes the back electrode 14 that forms an ohmic contact with the $n^+$-type silicon carbide substrate 1. Thereafter, unreacted portions of the nickel film are selectively removed, thereby leaving, for example, the first source electrodes 13a in the contact holes.

Next, for example, by a sputtering method, the first TiN film 25, the first Ti film 26, the second Ti film 27, and the second Ti film 28 are sequentially deposited so as to cover the interlayer insulating film 11 and the first source electrodes 13a of the front surface of the silicon carbide semiconductor base, and the Al alloy film 29 is formed so as to have a thickness of, for example, about 5 μm. The Al alloy film 29 is, for example, an Al—Si film or an Al—Si—Cu film. The Al alloy film 29 may be an Al film. This conductive film is patterned by photolithography to be left in the active region 150 of an entire area of the device element, whereby the first source electrode pad 15a is formed.

Next, a polyimide film is formed on the Al alloy film 29 and thereafter, the polyimide film is selectively removed by photolithography and etching, thereby forming the first protective films 21 and openings in the first protective films 21. Next, on the Al alloy film 29 exposed in the openings of the first protective films 21, the plating films 16 are formed.

Next, the second protective films 23 are formed so as to cover borders between the plating films 16 and the first protective films 21. The second protective films 23 is, for example, a polyimide film. Thereafter, the external terminal electrodes 19 are formed on the plating films 16 via the solder 17.

Device elements other than the main semiconductor device element 42 (for example, the current sensing portion 37a, for example, a diffusion diode constituting the overvoltage protecting portion, a complementary MOS (CMOS) configuring the arithmetic circuit portion) suffice to be formed in the high-function region 400 of the silicon carbide semiconductor device 600 concurrently with corresponding regions of the main semiconductor device element 42 described above. Further, formation may be by a separate process from that for the main semiconductor device element 42. Thus, the silicon carbide semiconductor device depicted in FIGS. 1 and 2 are completed.

As described above, according to the silicon carbide semiconductor device according to the embodiment, the structures differ due to the first interface portion of the main semiconductor device element and the second interface portion of the current sensing portion. As a result, values of the characteristics of the main semiconductor device element and values of the characteristics of the current sensing portion differ. In the embodiment, the rate of change of the drain-source current with respect to the drain-source voltage of the current sensing portion is at least 10% higher than the rate of change of the drain-source current with respect to the drain-source voltage of the main semiconductor device element. As a result, in an instance of use via sensing resistance between the earth potential and the source electrodes of the current sensing portion, characteristics of the current sensing portion may be set to similar to the characteristics of the main semiconductor device element. Therefore, instances in which the drain-source current measured at the current sensing portion is detected to be lower than the drain-source current of the main semiconductor device element are eliminated and destruction of the semiconductor device element due to an inability to detect overcurrent flowing in the main semiconductor device element may be prevented.

In the foregoing, various modifications within a range not departing from the spirit of the invention are possible, for example, in the embodiments, dimensions, impurity concentrations, etc. of regions are variously set according to necessary specifications. For example, the trench-type may be replaced with a planar-type, the MOSFET may be replaced with an IGBT. Further, in the embodiments described above, while an instance in which silicon carbide is used as a wide bandgap semiconductor is described as an example, application is further possible for a wide bandgap semiconductor other than silicon carbide, for example, gallium nitride (GaN), and a semiconductor such as Si, germanium (Ge), etc. Further, in the embodiments, while the first conductivity type is assumed to be an n and the second conductivity type is assumed to be a p-type, the invention is similarly implemented when the first conductivity type is a p-type and the second conductivity type is an n-type.

According to the embodiments described above, the structure differs by the first interface portion (first portion) of the main semiconductor device element (first MOS structure portion) and the second interface portion (second portion) of the current sensing portion (second MOS structure portion). As a result, a characteristics value of the main semiconductor device element and a characteristics value of the current sensing portion differ from each other. The rate of change of the drain-source current with respect to the drain-source voltage of the current sensing portion is set to be at least 10% higher than the rate of change of the drain-source current with respect to the drain-source voltage of the main semiconductor device element. As a result, in an instance of use via the sensing resistance between the earth potential and the source electrodes of the current sensing portion, the characteristics of the current sensing portion may be set to be similar to the characteristics of the main semiconductor device element. Therefore, instances in which the drain-source current measured at the current sensing portion is detected to be lower than the drain-source current of the main semiconductor device element are eliminated and destruction of the semiconductor device element due to an inability to detect overcurrent flowing in the main semiconductor device element may be prevented.

The semiconductor device according to the invention achieves an effect in that by improving the structure of high-function regions, the characteristics of the current sensing portion may be improved.

As described above, the semiconductor device according to the invention is useful for power semiconductor devices used in power converting equipment such as inverters, power source devices of various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
a first MOS structure portion having the following elements:
a semiconductor substrate of a first conductivity type, having a front surface and a back surface opposite to each other;
a first semiconductor layer of the first conductivity type, provided on the front surface of the semiconductor substrate and having an impurity concentration that is lower than an impurity concentration of the semiconductor substrate, the first semiconductor layer having a first surface and a second surface opposite to each other, the second surface facing the semiconductor substrate;
a first second-semiconductor-layer of a second conductivity type, provided on the first surface of the first semiconductor layer, the first second-semiconductor-layer having a first surface and a second surface opposite to each other, the second surface facing the semiconductor substrate;
a plurality of first first-semiconductor-regions of the first conductivity type, selectively provided in the first second-semiconductor-layer, at the first surface thereof, each of the plurality of first first-semiconductor-regions having a first surface and a second surface opposite to each other, the second surface facing the semiconductor substrate;
a plurality of first trenches that penetrate respective ones of the plurality of first first-semiconductor-regions and penetrate the first second-semiconductor-layer, and reach the first semiconductor layer;
a plurality of first gate insulating films provided in respective ones of the plurality of first trenches, and being in contact with the first second-semiconductor-layer;
a plurality of first gate electrodes provided on respective ones of the plurality of first gate insulating films in the respective ones of the plurality of first trenches;
a plurality of first first-electrodes provided on the first surface of the first second-semiconductor-layer and respective ones of the first surfaces of the plurality of first first-semiconductor-regions; and
a second electrode provided on the back surface of the semiconductor substrate;
a second MOS structure portion that detects overcurrent flowing in the first MOS structure portion, the second MOS structure portion including the following elements:
the semiconductor substrate;
the first semiconductor layer;
a second second-semiconductor-layer of the second conductivity type, provided on the first surface of the first semiconductor layer;
a plurality of second first-semiconductor-regions of the first conductivity type, selectively provided in the second second-semiconductor-layer, at the first surface thereof, each of the plurality of second first-semiconductor-regions having a first surface and a second surface opposite to each other, the second surface facing the semiconductor substrate;
a plurality of second trenches that penetrate respective ones of the plurality of second first-semiconductor-regions and penetrate the second second-semiconductor-layer, and reach the first semiconductor layer;
a plurality of second gate insulating films provided in respective ones of the plurality of second trenches, and being in contact with the second second-semiconductor-layer;
a plurality of second gate electrodes provided on respective ones of the plurality of second gate insulating films in the respective ones of the plurality of second trenches;

a plurality of second first-electrodes provided on the first surface of the second second-semiconductor-layer and respective ones of the first surfaces of the plurality of second first-semiconductor-regions; and
the second electrode,
wherein
a bottom of each of the plurality of first trenches has a radius of curvature that differs from a radius of curvature of a bottom of each of the plurality of second trenches.

2. The semiconductor device according to claim 1, further comprising:
a first portion that includes all of the elements of the first MOS structure portion other than the plurality of first first-semiconductor-regions and the plurality of first gate insulating films, the first portion being located below the first surfaces of the plurality of first first-semiconductor-regions; and
a second portion that includes all of the elements of the second MOS structure portion other than the plurality of second first-semiconductor-regions and the plurality of second gate insulating films, the second portion being located below the first surfaces of the plurality of second first-semiconductor-regions, wherein
the first MOS structure portion and the second MOS structure portion each have a plurality of MOS characteristics, and
among the elements of the first MOS structure portion and the second MOS structure portion, a structure of at least one element of the first portion that includes any one of a thickness or width thereof is not identical to a structure of at least one functionally corresponding element of the second portion so that the first MOS structure portion has a characteristic value obtained from one of the plurality of MOS characteristics that differs by at least 10% from a characteristic value of a corresponding MOS characteristic of the second MOS structure portion.

3. The semiconductor device according to claim 1, further comprising:
a first portion that includes all of the elements of the first MOS structure portion other than the plurality of first first-semiconductor-regions and the plurality of first gate insulating films, the first portion being located below the first surfaces of the plurality of first first-semiconductor-regions; and
a second portion that includes all of the elements of the second MOS structure portion other than the plurality of second first-semiconductor-regions and the plurality of second gate insulating films, the second portion being located below the first surfaces of the plurality of second first-semiconductor-regions, wherein
among the elements of the first MOS structure portion and the second MOS structure portion, a structure of at least one element of the first portion that includes any one of a thickness or width thereof is not identical to a structure of at least one functionally corresponding element of the second portion so that a first rate of change of a drain-source current with respect to a drain-source voltage of the second MOS structure portion is at least 10% higher than a second rate of change of the drain-source current with respect to a drain-source voltage of the first MOS structure portion.

4. The semiconductor device according to claim 1, further comprising:
a first portion that includes all of the elements of the first MOS structure portion other than the plurality of first first-semiconductor-regions and the plurality of first gate insulating films, the first portion being located below the first surfaces of the plurality of first first-semiconductor-regions; and
a second portion that includes all of the elements of the second MOS structure portion other than the plurality of second first-semiconductor-regions and the plurality of second gate insulating films, the second portion being located below the first surfaces of the plurality of second first-semiconductor-regions, wherein
among the elements of the first MOS structure portion and the second MOS structure portion, at least one element of the first portion has a level or a material different from a level or a material of at least one functionally corresponding element of the second portion, a level of an element being defined by a total number of the elements that are disposed between the semiconductor substrate and said element.

5. The semiconductor device according to claim 1, further comprising:
a first portion that includes all of the elements of the first MOS structure portion other than the plurality of first first-semiconductor-regions and the plurality of first gate insulating films, the first portion being located below the first surfaces of the plurality of first first-semiconductor-regions; and
a second portion that includes all of the elements of the second MOS structure portion other than the plurality of second first-semiconductor-regions and the plurality of second gate insulating films, the second portion being located below the first surfaces of the plurality of second first-semiconductor-regions, wherein
among the elements of the first MOS structure portion and the second MOS structure portion, any one of a width or a thickness of at least one element of the first portion, or an interval between the same elements adjacent to each other of the first portion differs by at least 10% from a width or a thickness of at least one functionally corresponding element of the second portion, or an interval between functionally corresponding same elements adjacent to each other of the second portion.

6. The semiconductor device according to claim 1, further comprising:
a first portion that includes all of the elements of the first MOS structure portion other than the plurality of first first-semiconductor-regions and the plurality of first gate insulating films, the first portion being located below the first surfaces of the plurality of first first-semiconductor-regions; and
a second portion that includes all of the elements of the second MOS structure portion other than the plurality of second first-semiconductor-regions and the plurality of second gate insulating films, the second portion being located below the first surfaces of the plurality of second first-semiconductor-regions, wherein
among the elements of the first MOS structure portion and the second MOS structure portion, at least one element of the first portion has an impurity concentration that differs by at least 10% from an impurity concentration of at least one functionally corresponding element of the second portion.

7. The semiconductor device according to claim 1, wherein
the radius of curvature of the bottom of each of the plurality of first trenches differs by at least 10% from the radius of curvature of the bottom of each of the plurality of second trenches.

8. A semiconductor device, comprising:
a first MOS structure portion having the following elements:
  a semiconductor substrate of a first conductivity type, having a front surface and a back surface opposite to each other;
  a first semiconductor layer of the first conductivity type, provided on the front surface of the semiconductor substrate and having an impurity concentration that is lower than an impurity concentration of the semiconductor substrate, the first semiconductor layer having a first surface and a second surface opposite to each other, the second surface facing the semiconductor substrate;
  a first second-semiconductor-layer of a second conductivity type, provided on the first surface of the first semiconductor layer, the first second-semiconductor-layer having a first surface and a second surface opposite to each other, the second surface facing the semiconductor substrate;
  a plurality of first first-semiconductor-regions of the first conductivity type, selectively provided in the first second-semiconductor-layer, at the first surface thereof, each of the plurality of first first-semiconductor-regions having a first surface and a second surface opposite to each other, the second surface facing the semiconductor substrate;
  a plurality of first trenches that penetrate respective ones of the plurality of first first-semiconductor-regions and penetrate the first second-semiconductor-layer, and reach the first semiconductor layer;
  a plurality of first gate insulating films provided in respective ones of the plurality of first trenches, and being in contact with the first second-semiconductor-layer;
  a plurality of first gate electrodes provided on respective ones of the plurality of first gate insulating films in the respective ones of the plurality of first trenches;
  a plurality of first second-semiconductor-regions of the second conductivity type, provided in the first semiconductor layer, the plurality of first second-semiconductor-regions being in contact with respective ones of bottoms of the plurality of first trenches;
  a plurality of first first-electrodes provided on the first surface of the first second-semiconductor-layer and respective ones of the first surfaces of the plurality of first first-semiconductor-regions; and
  a second electrode provided on the back surface of the semiconductor substrate;
a second MOS structure portion that detects overcurrent flowing in the first MOS structure portion, the second MOS structure portion including the following elements:
  the semiconductor substrate;
  the first semiconductor layer;
  a second second-semiconductor-layer of the second conductivity type, provided on the first surface of the first semiconductor layer;
  a plurality of second first-semiconductor-regions of the first conductivity type, selectively provided in the second second-semiconductor-layer, at the first surface thereof, each of the plurality of second first-semiconductor-regions having a first surface and a second surface opposite to each other, the second surface facing the semiconductor substrate;
  a plurality of second trenches that penetrate respective ones of the plurality of second first-semiconductor-regions and penetrate the second second-semiconductor-layer, and reach the first semiconductor layer;
  a plurality of second gate insulating films provided in respective ones of the plurality of second trenches, and being in contact with the second second-semiconductor-layer;
  a plurality of second gate electrodes provided on respective ones of the plurality of second gate insulating films in the respective ones of the plurality of second trenches;
  a plurality of second second-semiconductor-regions of the second conductivity type provided in the first semiconductor layer, the plurality of second second-semiconductor-regions being in contact with respective ones of bottoms of the plurality of second trenches;
  a plurality of second first-electrodes provided on the first surface of the second second-semiconductor-layer and respective ones of the first surfaces of the plurality of second first-semiconductor-regions; and
  the second electrode, wherein
each of the plurality of first second-semiconductor-regions has a first corner portion facing the second electrode, and each of the plurality of second second-semiconductor-regions has a second corner portion facing the second electrode, the first corner portion having a radius of curvature that differs from a radius of curvature of the second corner portion.

9. The semiconductor device according to claim 8, wherein
the radius of curvature of the first corner portion differs by at least 10% from the radius of curvature of the second corner portion.

10. A semiconductor device, comprising:
a first MOS structure portion having the following elements:
  a semiconductor substrate of a first conductivity type, having a front surface and a back surface opposite to each other;
  a first semiconductor layer of the first conductivity type, provided on the front surface of the semiconductor substrate and having an impurity concentration that is lower than an impurity concentration of the semiconductor substrate, the first semiconductor layer having a first surface and a second surface opposite to each other, the second surface facing the semiconductor substrate;
  a first second-semiconductor-layer of a second conductivity type, provided on the first surface of the first semiconductor layer, the first second-semiconductor-layer having a first surface and a second surface opposite to each other, the second surface facing the semiconductor substrate;
  a plurality of first first-semiconductor-regions of the first conductivity type, selectively provided in the first second-semiconductor-layer, at the first surface thereof, each of the plurality of first first-semiconductor-regions having a first surface and a second surface opposite to each other, the second surface facing the semiconductor substrate;
  a plurality of first trenches that penetrate respective ones of the plurality of first first-semiconductor-regions and penetrate the first second-semiconductor-layer, and reach the first semiconductor layer;

a plurality of first gate insulating films provided in respective ones of the plurality of first trenches and being in contact with the first second-semiconductor-layer;

a plurality of first gate electrodes provided on respective ones of the plurality of first gate insulating films in the respective ones of the plurality of first trenches;

a plurality of first third-semiconductor-regions of the second conductivity type, provided in the first semiconductor layer at the first surface thereof;

a plurality of first first-electrodes provided on the first surface of the first second-semiconductor-layer and respective ones of the first surfaces of the plurality of first first-semiconductor-regions; and a second electrode provided on the back surface of the semiconductor substrate;

a second MOS structure portion that detects overcurrent flowing in the first MOS structure portion, the second MOS structure portion including the following elements:

the semiconductor substrate;

the first semiconductor layer;

a second second-semiconductor-layer of the second conductivity type, provided on the first surface of the first semiconductor layer;

a plurality of second first-semiconductor-regions of the first conductivity type, selectively provided in the second second-semiconductor-layer, at the first surface thereof, each of the plurality of second first-semiconductor-regions having a first surface and a second surface opposite to each other, the second surface facing the semiconductor substrate;

a plurality of second trenches that penetrate respective ones of the plurality of second first-semiconductor-regions and penetrate the second second-semiconductor-layer, and reach the first semiconductor layer;

a plurality of second gate insulating films provided in respective ones of the plurality of second trenches and being in contact with the second second-semiconductor-layer;

a plurality of second gate electrodes provided on respective ones of the plurality of second gate insulating films in the respective ones of the plurality of second trenches;

a plurality of second third-semiconductor-regions of the second conductivity type, provided in the first semiconductor layer at the first surface thereof;

a plurality of second first-electrodes provided on the first surface of the second second-semiconductor-layer and respective ones of the first surfaces of the plurality of second first-semiconductor-regions; and the second electrode, wherein each of the plurality of first third-semiconductor-regions has a first corner portion facing the second electrode, and each of the plurality of second third-semiconductor-regions has a second corner portion facing the second electrode, the first corner portion having a radius of curvature that differs from a radius of curvature of the second corner portion.

11. The semiconductor device according to claim 10, wherein the radius of curvature of the first corner portion differs by at least 10% from the radius of curvature of the second corner portion.

* * * * *